(12) United States Patent
Kim

(10) Patent No.: US 12,183,690 B2
(45) Date of Patent: Dec. 31, 2024

(54) SEMICONDUCTOR PACKAGE

(71) Applicant: SAMSUNG ELECTRONICS CO., LTD., Suwon-si (KR)

(72) Inventor: Jongyoun Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/853,181

(22) Filed: Jun. 29, 2022

(65) Prior Publication Data
US 2022/0336375 A1    Oct. 20, 2022

Related U.S. Application Data

(63) Continuation of application No. 17/004,087, filed on Aug. 27, 2020, now Pat. No. 11,387,192.

(30) Foreign Application Priority Data

Dec. 31, 2019  (KR) .......................... 10-2019-0179975

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC . H01L 23/562; H01L 23/3128; H01L 23/367; H01L 23/5383; H01L 23/5386;
(Continued)

(56) References Cited

U.S. PATENT DOCUMENTS 7,307,342 B2   12/2007  Jeong et al.
7,476,968 B2   1/2009   Shindo
(Continued)

FOREIGN PATENT DOCUMENTS

JP       3389517     3/2003
JP       5873146     3/2016
(Continued)

*Primary Examiner* — Dao H Nguyen
(74) *Attorney, Agent, or Firm* — F. CHAU & ASSOCIATES, LLC

(57) ABSTRACT

A semiconductor package includes a semiconductor chip, a redistribution insulating layer having a first opening, and an external connection bump including a first portion filling the first opening. A lower bump pad includes a first surface and a second surface opposite the first surface. The first surface includes a contact portion that directly contacts the first portion of the external connection bump and a cover portion surrounding side surfaces of the contact portion. A first conductive barrier layer surrounds side surfaces of the lower bump pad and is disposed between the lower bump pad and the redistribution insulating layer. A redistribution pattern directly contacts the second surface of the lower bump pad and is configured to electrically connect the lower bump pad to the semiconductor chip.

20 Claims, 22 Drawing Sheets

(51) Int. Cl.
*H01L 21/56* (2006.01)
*H01L 21/683* (2006.01)
*H01L 21/78* (2006.01)
*H01L 23/31* (2006.01)
*H01L 23/367* (2006.01)
*H01L 23/538* (2006.01)

(52) U.S. Cl.
CPC .......... *H01L 21/565* (2013.01); *H01L 21/568* (2013.01); *H01L 21/6835* (2013.01); *H01L 21/78* (2013.01); *H01L 23/3128* (2013.01); *H01L 23/367* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01); *H01L 2924/35121* (2013.01)

(58) Field of Classification Search
CPC ............. H01L 21/4853; H01L 21/4857; H01L 21/565; H01L 21/568; H01L 21/6835; H01L 21/78; H01L 24/19; H01L 24/20; H01L 24/16
See application file for complete search history.

(56) References Cited

U.S. PATENT DOCUMENTS

| | | | |
|---|---|---|---|
| 8,426,303 | B2 | 4/2013 | Suzuki et al. |
| 8,575,018 | B2 | 11/2013 | Lin et al. |
| 8,872,306 | B2 | 10/2014 | Jin et al. |
| 9,780,052 | B2 | 10/2017 | Mariottini et al. |
| 10,157,823 | B2 | 12/2018 | Kim et al. |
| 2007/0096306 | A1 | 5/2007 | Yamagata |
| 2007/0184578 | A1 | 8/2007 | Lin et al. |
| 2010/0207271 | A1 | 8/2010 | Omi |
| 2012/0248605 | A1 | 10/2012 | Yamaguchi |
| 2014/0061888 | A1* | 3/2014 | Lin .................. H01L 23/49894 438/118 |
| 2018/0012774 | A1 | 1/2018 | Hu |
| 2018/0068963 | A1 | 3/2018 | Wu et al. |
| 2018/0108626 | A1 | 4/2018 | Misra et al. |
| 2018/0138114 | A1* | 5/2018 | Lee .................. H01L 23/49838 |
| 2018/0151546 | A1* | 5/2018 | Lin ....................... H01L 24/09 |
| 2019/0131225 | A1 | 5/2019 | Jeong et al. |
| 2019/0139925 | A1* | 5/2019 | Yu ........................ H01L 24/24 |
| 2019/0385989 | A1* | 12/2019 | Yu ..................... H01L 23/5386 |
| 2020/0075496 | A1* | 3/2020 | Yu ........................ H01L 24/32 |
| 2020/0273805 | A1* | 8/2020 | Wu ....................... H01L 24/17 |
| 2021/0057347 | A1* | 2/2021 | Liu ........................ H01L 24/82 |
| 2021/0202402 | A1 | 7/2021 | Kim |

FOREIGN PATENT DOCUMENTS

| | | |
|---|---|---|
| KR | 10-0605315 | 7/2006 |
| KR | 10-2010-0079138 | 7/2010 |
| KR | 10-2015-0034967 | 4/2015 |
| KR | 10-2017-0077133 | 7/2017 |

* cited by examiner

III - III'

SEMICONDUCTOR PACKAGE

CROSS-REFERENCE TO RELATED APPLICATIONS

This application is a continuation of U.S. patent application Ser. No. 17/004,087 filed on Aug. 27, 2020, which claims priority under 35 U.S.C. § 119 to Korean Patent Application No. 10-2019-0179975, filed on Dec. 31, 2019 in the Korean Intellectual Property Office, the disclosures of which are incorporated by reference in their entireties herein.

1. TECHNICAL FIELD

One or more embodiments of the present inventive concepts relate to a semiconductor package.

2. DISCUSSION OF RELATED ART

In recent developments in the electronic products industry, the demand for portable electronic devices has rapidly increased. Therefore, there has been an increase in demand for electronic components of the portable electronic devices to have a compact size and weight reduction. A semiconductor package mounted on the portable electronic device may process data at a high capacity and provides a compact size and weight reduction of the electronic components.

In semiconductor packages having a compact size and weight reduction, stress may be concentrated on a lower bump pad and a redistribution insulating layer of the semiconductor package due to external stress. The stress may cause cracks to propagate along a side surface of the lower bump pad. Therefore, the lower bump pad and the redistribution insulating layer are frequently peeled off by the cracks. The lower bump pad and the redistribution insulating layer may also be peeled off by heat generated from the semiconductor package.

SUMMARY

One or more exemplary embodiments of the present inventive concepts provide a semiconductor package that has improved reliability.

According to an exemplary embodiment of the present inventive concepts, a semiconductor package includes a semiconductor chip, a redistribution insulating layer having a first opening and an external connection bump including a first portion filling the first opening. A lower bump pad includes a first surface and a second surface opposite the first surface. The first surface includes a contact portion that directly contacts the first portion of the external connection bump and a cover portion surrounding side surfaces of the contact portion. A first conductive barrier layer surrounds side surfaces of the lower bump pad and is disposed between the lower bump pad and the redistribution insulating layer. A redistribution pattern directly contacts the second surface of the lower bump pad and is configured to electrically connect the lower bump pad to the semiconductor chip.

According to another exemplary embodiment of the present inventive concepts, a semiconductor package includes a semiconductor chip, a redistribution insulating layer including an opening and an external connection bump including a first portion filling the opening. A lower bump pad includes a first surface and a second surface opposite the first surface. The first surface includes a contact portion that directly contacts the first portion of the external connection bump and a cover portion surrounding side surfaces of the contact portion and is covered with the redistribution insulating layer. A first conductive barrier layer surrounds side surfaces of the lower bump pad and is disposed between a side surface of the lower bump pad and the redistribution insulating layer in a horizontal direction. A second conductive barrier layer is disposed on the cover portion of the lower bump pad and surrounds a side wall of the external connection bump. A surface of the external connection bump contacting the contact portion of the lower bump pad is coplanar in a vertical direction with a surface of the second conductive barrier layer that directly contacts the cover portion of the lower bump pad. The vertical direction is perpendicular to the horizontal direction.

According to another exemplary embodiment of the present inventive concepts, a semiconductor package includes a semiconductor chip, a redistribution insulating layer including an opening and an external connection bump including a first portion filling the opening. A lower bump pad includes a first conductive layer that directly contacts a first portion of the external connection bump, a diffusion barrier layer disposed on the first conductive layer, and a second conductive layer disposed on the diffusion barrier layer and spaced apart from the first conductive layer in a vertical direction. A first conductive barrier layer surrounds side surfaces of the lower bump pad and is disposed between the lower bump pad and the redistribution insulating layer in a horizontal direction that is perpendicular to the vertical direction.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF EXEMPLARY EMBODIMENTS

Figure 1:
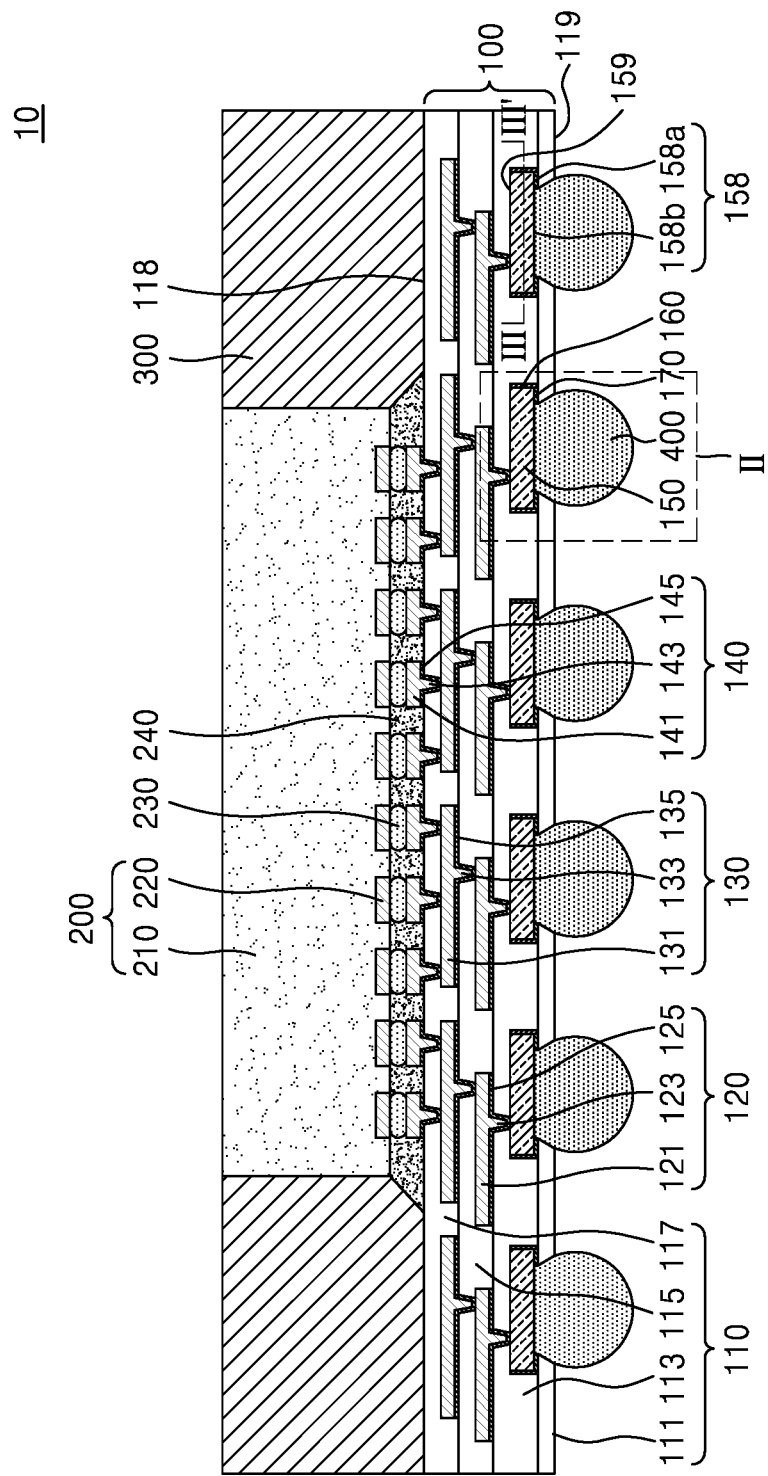
FIG. 1 is a cross-sectional view showing a semiconductor package according to an exemplary embodiment of the present inventive concepts.

Hereinafter, exemplary embodiments of the present inventive concepts will be described in detail with reference to the accompanying drawings. The same reference numerals will be used for the same elements in the drawings, and redundant descriptions thereof will be omitted.

Figure 2:
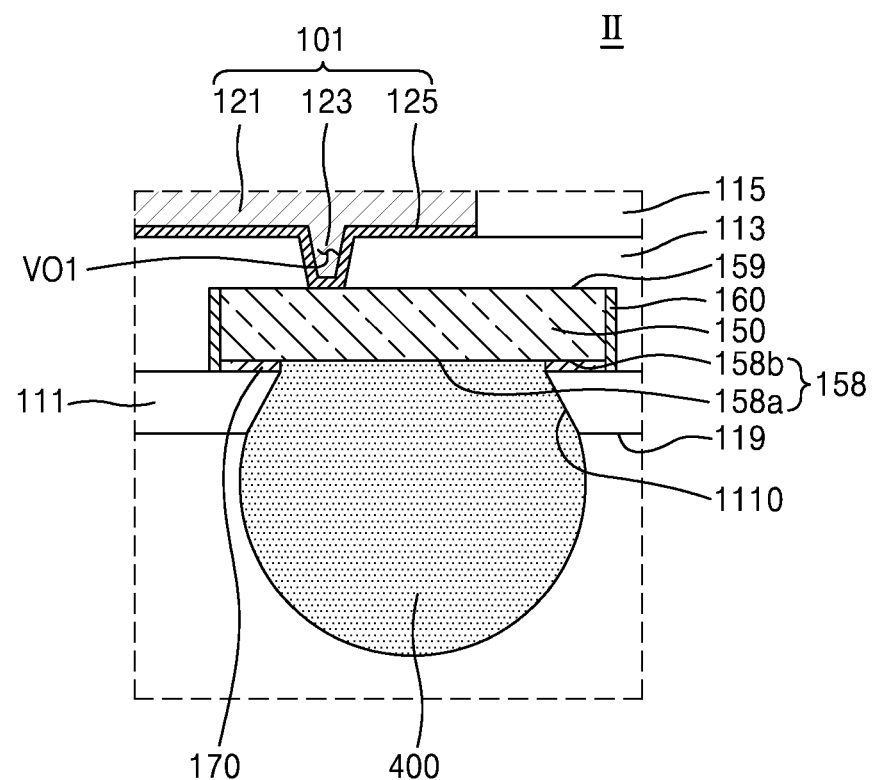
FIG. 2 is an enlarged cross-sectional view showing area II in FIG. 1 according to an exemplary embodiment of the present inventive concepts.
Figure 3:
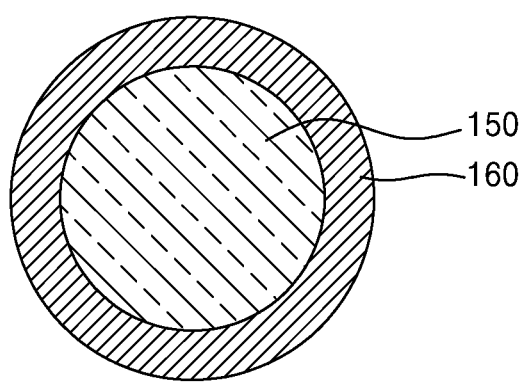
FIG. 3 is a cross-sectional view taken along line III-III' of FIG. 1, showing a lower bump pad and a first conductive barrier layer according to an exemplary embodiment of the present inventive concepts.

FIG. 1 is a cross-sectional view showing a semiconductor package 10 according to an exemplary embodiment of the present inventive concepts. FIG. 2 is an enlarged diagram showing area II of FIG. 1. FIG. 3 is a cross-sectional view taken along line III-III' of FIG. 1 showing a lower bump pad 150 and a first conductive barrier layer 160.

Referring to FIGS. 1 to 3, the semiconductor package 10 according to an exemplary embodiment of the present inventive concepts may include a redistribution structure 100, a semiconductor chip 200, a molding layer 300, and an external connection bump 400.

The redistribution structure 100 may include a redistribution insulating layer 110, first to third redistribution patterns 120, 130, and 140, the lower bump pad 150, the first conductive barrier layer 160, and a second conductive barrier layer 170.

In an exemplary embodiment, the redistribution insulating layer 110 may include first to fourth redistribution insulating layers 111, 113, 115, and 117. For example, as shown in the exemplary embodiment of FIG. 1, the first redistribution insulating layer 111, the second redistribution insulating layer 113, the third redistribution insulating layer 115, and the fourth redistribution insulating layer 117 of the redistribution insulating layer 110 may be sequentially stacked in a vertical direction that is parallel to a thickness direction of the redistribution insulating layer 110 (e.g., a direction extending from a lower surface 119 of the redistribution insulating layer 110 to an upper surface 118 of the redistribution insulating layer 110). In an exemplary embodiment, each of the first to fourth redistribution insulating layers 111, 113, 115, and 117 may be formed from a material film made of an organic compound. For example, each of the first to fourth redistribution insulating layers 111, 113, 115, and 117 may be formed from a material film made of an organic polymer material. However, exemplary embodiments of the present inventive concepts are not limited thereto.

For example, in another exemplary embodiment, each of the first to fourth redistribution insulating layers 111, 113, 115, and 117 may include an insulating material made of a photo imageable dielectric (PID) material capable of performing a photolithography process. Alternatively, each of the first to fourth redistribution insulating layers 111, 113, 115, and 117 may be made of photosensitive polyimide (PSPI).

However, exemplary embodiments of the present inventive concepts are not limited thereto. Each of the first to fourth redistribution insulating layers 111, 113, 115, and 117 may also include oxide or nitride. For example, each of the first to fourth redistribution insulating layers 111, 113, 115, and 117 may include a compound selected from silicon oxide or silicon nitride.

Each of the first to third redistribution patterns 120, 130, and 140 may include first to third conductive line patterns 121, 131, and 141 and first to third conductive via patterns 123, 133, and 143. The first to third conductive line patterns 121, 131, and 141 may be disposed on at least one of an upper surface and a lower surface of each of the first to fourth redistribution insulating layers 111, 113, 115, and 117. The first to third conductive via patterns 123, 133, and 143 may penetrate at least one of the first to fourth redistribution insulating layers 111, 113, 115, and 117. The first to third conductive via patterns 123, 133, and 143 may be connected to at least one of the first to third conductive line patterns 121, 131, and 141 or to the lower bump pad 150.

The first to third redistribution patterns 120, 130, and 140 may include first to third redistribution pattern seed layers 125, 135, and 145. The first to third redistribution pattern seed layers 125, 135, and 145 may be disposed between any one of the first to fourth redistribution insulating layers 111, 113, 115, and 117 and any one of the first to third conductive line patterns 121, 131, and 141 and between any one of the first to fourth redistribution insulating layers 111, 113, 115, and 117 and any one of the first to third conductive via patterns 123, 133, and 143. For example, as shown in the exemplary embodiment of FIG. 1, the first redistribution pattern seed layer 125 may be disposed between the first conductive line pattern 121 and the second redistribution insulating layer 113 in the vertical direction and between the second redistribution insulating layer 113 and the first conductive via pattern 123. The second redistribution pattern seed layer 135 may be disposed between the second conductive line pattern 131 and the third redistribution insulating layer 115 in the vertical direction and between the third redistribution insulating layer 115 and the second conductive via pattern 133. The third redistribution pattern seed layer 145 may be disposed between the third conductive line pattern 141 and the fourth redistribution insulating layer 117 in the vertical direction and between the fourth redistribution insulating layer 117 and the third conductive via pattern 141.

In an exemplary embodiment, the first to third redistribution pattern seed layers 125, 135, and 145 may be formed by physical vapor deposition, and the first to third conductive line patterns 121, 131, and 141 and the first to third conductive via patterns 123, 133, and 143 may be formed by electroless plating. However, exemplary embodiments of the present inventive concepts are not limited thereto.

In an exemplary embodiment, the first to third redistribution pattern seed layers 125, 135, and 145 may be made of copper (Cu), titanium (Ti), titanium tungsten (TiW), titanium nitride (TiN), tantalum (Ta), tantalum nitride (TaN), chrome (Cr), aluminum (Al), or a combination thereof. For example, the first to third redistribution pattern seed layers 125, 135, and 145 may be made of Cu/Ti in which Cu is stacked on Ti or Cu/TiW in which Cu is stacked on TiW. However, exemplary embodiments of the present inventive concepts are not limited thereto and the first to third redistribution pattern seed layers 125, 135, and 145 may be made from various different compounds in other exemplary embodiments.

In an exemplary embodiment, the first to third conductive line patterns 121, 131, and 141 and the first to third conductive via patterns 123, 133, and 143 may include metal, such as Cu, Al, W, Ti, Ta, indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof. However, exemplary embodiments of the present inventive concepts are not limited thereto.

In an exemplary embodiment in which the first to third conductive line patterns 121, 131, and 141 and the first to third conductive via patterns 123, 133, and 143 are made of Cu, at least some portions of the first to third redistribution pattern seed layers 125, 135, and 145 may function as diffusion barriers.

In an exemplary embodiment, the lower bump pad 150 may be arranged in the redistribution insulating layer 110.

For example, as shown in the exemplary embodiment of FIG. 1, the lower bump pad ISO may be disposed in the second redistribution insulating layer 113. However, exemplary embodiments of the present inventive concepts are not limited thereto. The external connection bump 400 may be attached to a portion of the lower bump pad 150. The lower bump pad 150 may function as an under bump metallurgy (UBM) on which the external connection bump 400 is arranged. The semiconductor package 10 according to an exemplary embodiment of the present inventive concepts may be electrically connected to and mounted on a module substrate, a system board, or the like of an electronic product through the external connection bump 400.

In an exemplary embodiment, the lower bump pad 150 may be made of metal, such as Cu, Al, W, Ti, Ta, In, Mo, Mn, Co, Sn, Ni, Mg, Re, Be, Ga, Ru, or an alloy thereof. However, exemplary embodiments of the present inventive concepts are not limited thereto.

In an exemplary embodiment, the lower bump pad 150 may include a first surface 158 and a second surface 159 opposite each other. As shown in the exemplary embodiment of FIG. 2, the first surface 158 and/or the second surface 159 of the lower bump pad 150 may be flat. For example, the first surface 158 and/or the second surface 159 of the lower bump pad 150 may extend substantially in a horizontal direction that is perpendicular to the vertical direction and parallel to a direction in which the redistribution insulating layer 110 extends.

A portion of the first surface 158 of the lower bump pad 150 may directly contact the external connection bump 400, and a portion of the second surface 159 of the lower bump pad 150 may contact the first conductive via pattern 123.

As shown in the exemplary embodiment of FIG. 2, the first surface 158 of the lower bump pad 150 may include a contact portion 158a and a cover portion 158b. The contact portion 158a may be a portion of the first surface 158 of the lower bump pad 150 that is in direct contact with the external connection bump 400, and the cover portion 158b may be a portion of the first surface 158 that surrounds the contact portion 158a and directly contacts the second conductive barrier layer 170 to be described herein below. The cover portion 158b may not directly contact the external connection bump 400. For example, as shown in the exemplary embodiment of FIG. 2, the contact portion 158a may be a bottom portion of the lower bump pad 150 in a central portion (e.g., in the horizontal direction) of the lower bump pad 150 and the cover portion 158b may be disposed on lateral sides of the lower bump pad 150 to surround side surfaces (e.g., lateral ends) of the contact portion 158a. However, exemplary embodiments of the present inventive concepts are not limited thereto.

In an exemplary embodiment, a length in the vertical direction of the lower bump pad 150 may have an overall uniform value. For example, the length of the lower bump pad 150 in the vertical direction may be substantially constant from one lateral edge to an opposite lateral edge along the horizontal direction. In an exemplary embodiment, a length in the vertical direction of the lower bump pad 150 may have an overall uniform value within a range of about 5 μm to about 10 μm.

As shown in the exemplary embodiments of FIGS. 1-2, the redistribution structure 100 may include the first conductive barrier layer 160 surrounding side surfaces of the lower bump pad 150. For example, the first conductive barrier layer 160 may be disposed between side surfaces of the lower bump pad 150 and the second redistribution insulating layer 113 (e.g., in the horizontal direction).

As shown in the exemplary embodiment of FIG. 3, the first conductive barrier layer 160 may have a ring shape extending alongside surfaces of the lower bump pad 150. For example, the first conductive barrier layer 160 may contact side surfaces (e.g., an outer perimeter) of the lower bump pad 150 to surround side surfaces of the lower bump pad 150. The first conductive barrier layer 160 may also surround a side surface (e.g., a lateral end) of the second conductive barrier layer 170. For example, as shown in the exemplary embodiment of FIG. 2, an inner surface of the first conductive barrier layer 160 may directly contact a lateral end of the second conductive barrier layer 170.

In an exemplary embodiment, a length in the vertical direction of the first conductive barrier layer 160 may be substantially the same as a length in the vertical direction of the lower bump pad 150. For example, in an exemplary embodiment, a length in the vertical direction of the first conductive barrier layer 160 may be substantially the same as a length in the vertical direction of the lower bump pad 150 and may be in a range of about 5 μm to about 10 μm. The vertical direction may be parallel to a thickness direction of the redistribution insulating layer 110 (e.g., a direction extending from a lower surface 119 of the redistribution insulating layer 110 toward an upper surface 118 of the redistribution insulating layer 110).

In an exemplary embodiment, a thickness of the first conductive barrier layer 160 (e.g., a length in the horizontal direction) may be in a range of about 0.02 μm to about 0.07 μm. However, exemplary embodiments of the present inventive concepts are not limited thereto and the length in the horizontal direction of the first conductive barrier layer 160 may vary.

In an exemplary embodiment, the first conductive barrier layer 160 may be made of Cu, Ni, Ti, TiW, TiN, Ta, TaN, Cr, Al, or a combination thereof.

In addition, a material of the first conductive barrier layer 160 may include a material having excellent adhesion to the second redistribution insulating layer 113. For example, in an exemplary embodiment, the adhesion between the material of the first conductive barrier layer 160 and a material of the second redistribution insulating layer 113 may be stronger than the adhesion that a material of the lower bump pad 150 and the material of the second redistribution insulating layer 113 form. For example, in an exemplary embodiment in which the second redistribution insulating layer 113 includes a PID material, the lower bump pad 150 may include Cu and the first conductive barrier layer 160 covering a side surface of the lower bump pad 150 may include Ni or Ti.

In a common semiconductor package, a side surface of a lower bump pad (e.g., a lateral end of the lower bump pad) may directly contact a redistribution insulating layer. Stress tends to be concentrated at a portion in which a side surface of the lower bump pad and the redistribution insulating layer contact each other, due to heat generated from a semiconductor package or external stress applied to the semiconductor package. Such stress may cause cracks to propagate along a side surface of the lower bump pad, and the lower bump pad and the redistribution insulating layer are frequently peeled off by the cracks.

However, since the semiconductor package 10 according to an exemplary embodiment of the present inventive concepts may include the first conductive barrier layer 160 that covers side surfaces of the lower bump pad 150 and has excellent adhesion to the second redistribution insulating layer 113, the semiconductor package 10 may prevent cracks from propagating along a side surface of the lower bump pad 150, and the peeling of the lower bump pad 150 and the second redistribution insulating layer 13 may be prevented.

The redistribution structure 100 may include the second conductive barrier layer 170 disposed between the cover portion 158b of the first surface 158 of the lower bump pad 150 and an upper surface of the first redistribution insulating layer 111 (e.g., in the vertical direction).

In an exemplary embodiment, the second conductive barrier layer 170 may be made of Cu, Ni, Ti, TiW, TiN, Ta, TaN, Cr, Al, or a combination thereof.

In an exemplary embodiment, the second conductive barrier layer 170 may have a ring shape continuously extending along a lateral edge of the lower bump pad 150. The second conductive barrier layer 170 directly contacts a side wall on an upper surface of the external connection bump 400 and may surround the side wall on the upper surface of the external connection bump 400. For example, as shown in the exemplary embodiment of FIG. 2, a lateral end of the second conductive barrier layer 170 (e.g., the lateral end of the second conductive barrier layer 170 opposite to the lateral end that contacts the first conductive barrier layer 160) directly contacts a side wall of an upper portion of the external connection bump 400.

In an exemplary embodiment, a surface of the external connection bump 400 contacting the contact portion 158a of the first surface 158 of the lower bump pad 150 may be substantially coplanar (e.g., in the vertical direction) with a surface (e.g., an upper surface) of the second conductive barrier layer 170 contacting the cover portion 158b of the first surface 158 of the lower bump pad 150.

In an exemplary embodiment of the present inventive concepts, since an edge portion of the first surface 158 of the lower bump pad 150 of the semiconductor package 10 is covered by the redistribution insulating layer 110, stress concentration at an interface of the lower bump pad 150 and the external connection bump 400 may be lessened. Accordingly, since cracks are prevented from being formed around the lower bump pad 150, damage to the lower bump pad 150 and the first to third redistribution patterns 120, 130, and 140 may be prevented, and joining reliability between the semiconductor package 10 and a module substrate and board level reliability may be increased.

Hereinafter, the redistribution structure 100 of the semiconductor package 10 of the present inventive concepts will be described in greater detail.

In an exemplary embodiment, the first redistribution insulating layer 111 may include a pad opening 111O (refer to FIG. 20) exposing the lower bump pad 150. The external connection bump 400 is formed to fill the pad opening 111O and may directly contact the lower bump pad 150 exposed through the pad opening 111O.

In an exemplary embodiment, the contact portion 158a of the first surface 158 of the lower bump pad 150 may be in direct contact with the external connection bump 400 (e.g., a top surface of the external connection bump 400), and a portion of the second surface 159 of the lower bump pad 150 may be in direct contact with the first conductive via pattern 123.

A portion of the external connection bump 400 filling the pad opening 111O of the first redistribution insulating layer 111 and including the portion of the external connection bump 400 contacting the contact portion 158a of the first surface 158 of the lower bump pad may be defined as a first portion of the external connection bump 400. In an exemplary embodiment, the first portion of the external connection bump 400 may have a shape in which its width in the horizontal direction gradually increases from a portion co-planar with an upper surface of the first redistribution insulating layer 111 to a portion co-planar with the lower surface 119 of the redistribution insulating layer 110. For example, the first portion of the external connection bump 400 may have a shape in which its width in the horizontal direction gradually increases in a direction away from the first surface 158 of the lower bump pad 150. Likewise, the pad opening 111O of the first redistribution insulating layer 111 may have a shape in which its width in the horizontal direction gradually increases in a direction away from the first surface of the lower bump pad 150.

The cover portion 158b of the first surface 158 of the lower bump pad 150 may be covered with the second conductive barrier layer 170 (e.g., in the vertical direction). The second conductive barrier layer 170 may be covered by the first redistribution insulating layer 111 (e.g., in the vertical direction). For example, as shown in the exemplary embodiment of FIG. 2, a lower surface of the second conductive barrier layer 170 may directly contact an upper surface of the first redistribution insulating layer 111.

In an exemplary embodiment, a distance (e.g., in the vertical direction) between the second conductive barrier layer 170 and the lower surface 119 of the redistribution insulating layer 110 may be in a range of about 3 μm to about 20 μm. For example, when the distance between the second conductive barrier layer 170 and the lower surface 119 of the redistribution insulating layer 110 is less than 3 μm, since the lower bump pad 150 is not adequately covered by the first redistribution insulating layer 111, there is an increased possibility that cracks may occur around the lower bump pad 150 due to stress. In addition, when the distance between the second conductive barrier layer 170 and the lower surface 119 of the redistribution insulating layer 110 is greater than 20 μm, there is an increased possibility that the external connection bump 400 may not be adequately filled by the pad opening 111O and adhesion between the external connection bump 400 and the lower bump pad 150 or between the external connection bump 400 and a side wall of the pad opening 111O may be degraded.

In an exemplary embodiment, the second redistribution insulating layer 113 which includes a first via opening VO1 (refer to FIG. 14) exposing a portion of the second surface 159 of the lower bump pad 150 may be stacked on the first redistribution insulating layer 111 (e.g., in the vertical direction). The first redistribution pattern seed layer 125 may be formed on a partial portion of an upper surface of the second redistribution insulating layer 113, a side wall and bottom surface of the first via opening VO1, and a portion of the second surface 159 of the lower bump pad 150 exposed through the first via opening VO1.

A portion of the first redistribution pattern seed layer 125 may be disposed between the first conductive line pattern 121 and an upper surface of the second redistribution insulating layer 113, and another portion of the first redistribution pattern seed layer 125 may surround a side wall and a bottom surface of the first conductive via pattern 123 and may be disposed between the first conductive via pattern 123 and the second surface 159 of the lower bump pad 150.

The first conductive line pattern 121 and the first conductive via pattern 123 may be disposed on the first redistribution pattern seed layer 125 (e.g., in the vertical direction). In an exemplary embodiment, the first conductive line pattern 121 and the first conductive via pattern 123 may be formed at the same time through a plating process and may be integral with each other. The first conductive line pattern 121 may be disposed on a portion of the first redistribution pattern seed layer 125 that is disposed on an upper surface of the second redistribution insulating layer 113. The first conductive line pattern 121 is also disposed on the first conductive via pattern 123. The first conductive via pattern 123 may cover a portion of the first redistribution pattern seed layer 125 in the first via opening VO1 and fill the first via opening VOL. The first conductive via pattern 123 may extend in the vertical direction and penetrate through the second redistribution insulating layer 113 and may be connected to the first conductive line pattern 121 and the lower bump pad 150, respectively. For example, as shown in the exemplary embodiment of FIG. 2, the upper surface of the first conductive via pattern 123 may directly contact a lower surface of the first conductive line pattern 121 and the lower surface of the first conductive via pattern 123 may directly contact the first redistribution pattern seed layer 125 for connection to the lower bump pad 150.

In an exemplary embodiment, the first conductive via pattern 123 may have a shape in which its width in the horizontal direction gradually increases upward. For example, the first conductive via pattern 123 may have a shape in which its cross-sectional surface area in the horizontal direction gradually increases away from the second surface 159 of the lower bump pad 150 and towards the first conductive line pattern 121. Likewise, the first via opening VO1 may have a shape in which its width in the horizontal direction gradually increases in a direction away from the second surface 159 of the lower bump pad 150 and towards the first conductive line pattern 121.

The third redistribution insulating layer 115 that includes a second via opening VO2 (refer to FIG. 16) and which covers one portion of the first conductive line pattern 121 and exposes another portion of the first conductive line pattern 121 thereby may be stacked on the second redistribution insulating layer 113 (e.g., in the vertical direction). The second redistribution seed layer 135 may be disposed on a partial portion of an upper surface of the third redistribution insulating layer 115, a side wall and bottom surface of the second via opening VO2, and a portion of an upper surface of the first conductive line pattern 121 exposed through the second via opening VO2. One portion of the second redistribution seed layer 135 may be disposed between the second conductive line pattern 131 and an upper surface of the third redistribution insulating layer 115 (e.g., in the vertical direction), and another portion of the second redistribution seed layer 135 may surround a side wall of the second conductive via pattern 133 and may be disposed between the second conductive via pattern 133 and the first conductive line pattern 121.

The second conductive via pattern 133 and the second conductive line pattern 131 may be disposed on the second redistribution seed layer 135 (e.g., in the vertical direction). In an exemplary embodiment, the second conductive via pattern 133 and the second conductive line pattern 131 may be formed through a plating process, and may be integral with each other. The second conductive line pattern 131 may be disposed on a portion of the second redistribution seed layer 135 that is disposed on an upper surface of the third redistribution insulating layer 115. The second conductive line pattern 131 is also disposed on the second conductive via pattern 133. The second conductive via pattern 133 may cover a portion of the second redistribution pattern seed layer 135 in the second via opening VO2 and fill the second via opening VO2. The second conductive via pattern 133 may extend in the vertical direction and penetrate through the third redistribution insulating layer 115 and may be connected to the second conductive line pattern 131 and the first conductive line pattern 121, respectively. For example, as shown in the exemplary embodiment of FIG. 1, the upper surface of the second conductive via pattern 133 may directly contact a lower surface of the second conductive line pattern 131 and the lower surface of the second conductive via pattern 133 may directly contact the second redistribution pattern seed layer 135 for connection to the first conductive line pattern 121.

In an exemplary embodiment, the second conductive via pattern 133 may have a shape in which its cross-sectional surface area in the horizontal direction gradually increases upward. For example, the second conductive via pattern 133 may have a shape in which its cross-sectional surface area in the horizontal direction gradually increases in a direction from a lower surface of the second conductive via pattern 133 towards the second conductive line pattern 131.

The fourth redistribution insulating layer 117 that includes a third via opening VO3 (refer to FIG. 16) and which covers one portion of the second conductive line pattern 131 and exposes another portion of the second conductive line pattern 131 thereby may be stacked on the third redistribution insulating layer 115 (e.g., in the vertical direction). The third redistribution pattern seed layer 145 may be disposed on a partial portion of an upper surface of the fourth redistribution insulating layer 117, a side wall of the third via opening VO3, a bottom portion of the third via opening VO3 and a portion of an upper surface of the second conductive line pattern 131 exposed through the third via opening VO3. One portion of the third redistribution pattern seed layer 145 may be disposed between the third conductive line pattern 141 and an upper surface of the fourth redistribution insulating layer 117 (e.g., in the vertical direction), and another portion of the third redistribution pattern seed layer 145 may surround a side wall of the third conductive via pattern 143 and may be disposed between the third conductive via pattern 143 and the second conductive line pattern 131.

The third conductive via pattern 143 and the third conductive line pattern 141 may be disposed on the third redistribution pattern seed layer 145. In an exemplary embodiment, the third conductive via pattern 143 and the third conductive line pattern 141 may be formed through a plating process and may be integral with each other. The third conductive line pattern 141 may be disposed on the portion of the third redistribution pattern seed layer 145 disposed on an upper surface of the fourth redistribution insulating layer 117 and on the third conductive via pattern 143 (e.g., an upper surface of the third conductive via pattern 143). The third conductive via pattern 143 may cover the portion of the third redistribution pattern seed layer 145 in the third via opening VO3, thus filling the third via opening VO3. The third conductive via pattern 143 may extend in the vertical direction and penetrate through the fourth redistribution insulating layer 117 and may be connected to the third conductive line pattern 141 and the second conductive line pattern 131, respectively. For example, as shown in the exemplary embodiment of FIG. 1, the upper surface of the third conductive via pattern 143 may directly contact a lower surface of the third conductive line pattern 141 and the lower surface of the third conductive via pattern 143 may directly contact the third redistribution pattern seed layer 145 for connection to the second conductive line pattern 131.

In an exemplary embodiment, the third conductive via pattern 143 may have a shape in which its cross-sectional surface area in the horizontal direction gradually increases upward. For example, the third conductive via pattern 143 may have a shape in which its cross-sectional surface area in the horizontal direction gradually increases from the lower surface of the third conductive via pattern 143 to the third conductive line pattern 141.

At least a partial portion of the third conductive line pattern 141 of the third redistribution pattern 140 may be disposed below the semiconductor chip 200 and may function as a pad onto which a chip connection terminal 230 is attached.

It has been illustrated in FIG. 1 that the redistribution structure 100 includes the first to fourth redistribution insulating layers 111, 113, 115, and 117, the first to third conductive line patterns 121, 131, and 141, and the first to third conductive via patterns 123, 133, and 143. However, exemplary embodiments of the present inventive concepts are not limited thereto. For example, in other exemplary embodiments, the numbers of the redistribution insulating layers, conductive line patterns, and conductive via patterns may be modified in various ways, depending on a design of circuit wiring in the redistribution structure 100.

The semiconductor chip 200 may be attached onto the redistribution structure 100. For example, in an exemplary embodiment, the semiconductor chip 200 may be mounted on the redistribution structure 100 in a flip chip method.

The semiconductor chip 200 may include a memory chip or a logic chip. Examples of the memory chip may include a volatile memory chip, such as dynamic random access memory (DRAM) or static random access memory (SRAM) or a non-volatile memory chip, such as phase-change random access memory (PRAM), magneto resistive random access memory (MRAM), ferroelectric random access memory (FeRAM), or resistive random access memory (RRAM). In an exemplary embodiment, the memory chip may include a high bandwidth memory (HBM) DRAM semiconductor chip. In addition, the logic chip may include, for example, a microprocessor, an analog device, or a digital signal processor. However, exemplary embodiments of the present inventive concepts are not limited thereto.

The semiconductor chip 200 may include a semiconductor substrate 210 and a chip pad 220 disposed on one side of the semiconductor substrate 210.

In an exemplary embodiment, the semiconductor substrate 210 may include silicon (Si). Alternatively, the semiconductor substrate 210 may include a semiconductor element, such as germanium (Ge) or a compound semiconductor, such as silicon carbide (SiC), gallium arsenide (GaAs), indium arsenide (InAs), and indium phosphide (InP). The semiconductor substrate 210 may include an active surface and an inactive surface opposite the active surface. In an exemplary embodiment, the active surface of the semiconductor substrate 210 may face the redistribution structure 100. A semiconductor device including various types of a plurality of individual devices may be formed on the active surface of the semiconductor substrate 210 within the semiconductor chip 200.

In an exemplary embodiment, the semiconductor package 10 may be a fan-out structure semiconductor package, and a footprint occupied by the semiconductor chip 200 may be smaller than a footprint of the redistribution structure 100. In this embodiment, at least one of a plurality of lower bump pads 150 may be disposed at a position spaced apart outwardly from a side surface of the semiconductor chip 200 (e.g., a lateral side edge of the semiconductor chip 200). For example, at least one of the external connection bumps 400 contacting the lower bump pad 150 may not overlap the semiconductor chip 200 in the vertical direction.

The chip connection terminal 230 may be disposed between the chip pad 220 of the semiconductor chip 200 and the third conductive line pattern 141 (e.g., in the vertical direction). The chip connection terminal 230 may electrically connect the chip pad 220 of the semiconductor chip 200 to the third conductive line pattern 141. In an exemplary embodiment, the chip connection terminal 230 may include at least one of a pillar structure, a solder bump, a solder ball, and a solder layer. However, exemplary embodiments of the present inventive concepts are not limited thereto.

The semiconductor chip 200 may be provided with at least one of a control signal, a power signal, and a ground signal for operation of the semiconductor chip 200 or a data signal to be stored in the semiconductor chip 200 from the outside through the chip connection terminal 230, the first to third redistribution patterns 120, 130, and 140, the lower bump pad 150, and the external connection bump 400 or may provide the data stored in the semiconductor chip 200 to the outside therethrough.

An under-fill material layer 240 covering the chip connection terminal 230 and side surfaces of the third conductive line pattern 141 may be disposed between the semiconductor chip 200 and the redistribution structure 100. In an exemplary embodiment, the under-fill material layer 240 may be made of epoxy resin formed by a capillary under-fill method. In an exemplary embodiment, the under-fill material layer 240 may include a nonconductive film (NCF). However, exemplary embodiments of the present inventive concepts are not limited thereto.

As shown in the exemplary embodiment of FIG. 1, a molding layer 300 may be disposed on the upper surface 118 of the redistribution structure 100, thus covering at least a portion of the semiconductor chip 200. In an exemplary embodiment, the molding layer 300 may be made of an epoxy molding compound (EMC). However, exemplary embodiments of the present inventive concepts are not limited thereto and the molding layer 300 may be made of various other materials, such as an epoxy-based material, a thermosetting material, a thermoplastic material, a UV treatment material, and the like.

As shown in the exemplary embodiment of FIG. 1, the molding layer 300 may cover a portion of the upper surface 118 of the redistribution insulating layer 110 and lateral side surfaces of the semiconductor chip 200. However, the molding layer 300 may expose an upper surface of the semiconductor chip 200 to the outside. In an exemplary embodiment, an upper surface of the molding layer 300 may be coplanar with that of the semiconductor chip 200. For example, the upper surface of the molding layer 300 may have the same height (e.g., distance in the vertical direction from the lower surface 119 of the redistribution insulating layer 110) as the height of the upper surface of the semiconductor chip 200. In this embodiment, an upper surface of the semiconductor chip 200 may be exposed to the outside. Since the upper surface of the semiconductor chip 200 is exposed to the outside, the heat dissipation performance of the semiconductor package 10 may be improved. However, exemplary embodiments of the present inventive concepts are not limited thereto. For example, in another exemplary embodiment, the molding layer 300 may cover both a lateral side surface and an upper surface of the semiconductor chip 200.

Figure 4:
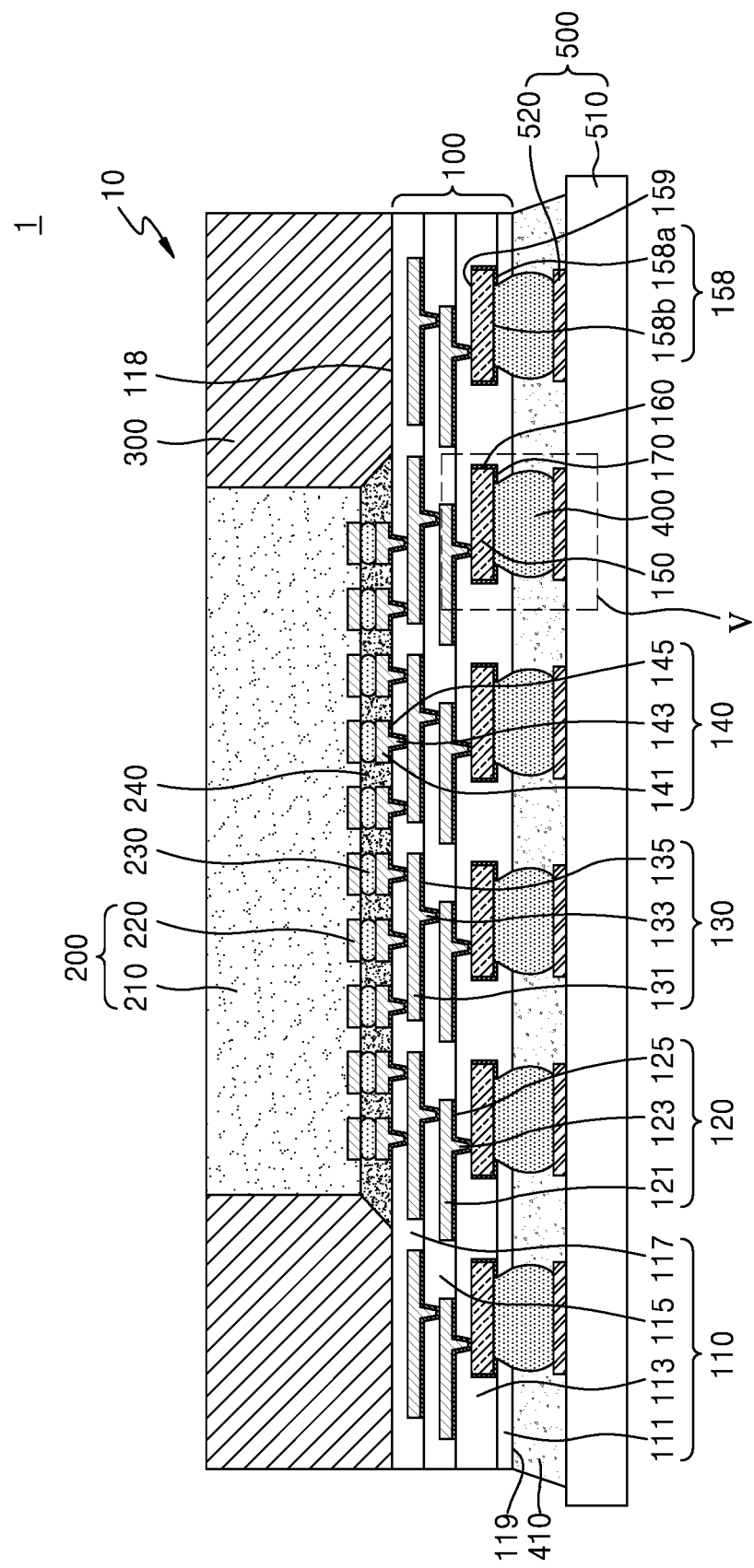
FIG. 4 is a cross-sectional view showing a semiconductor module according to an exemplary embodiment of the present inventive concepts.
Figure 5:
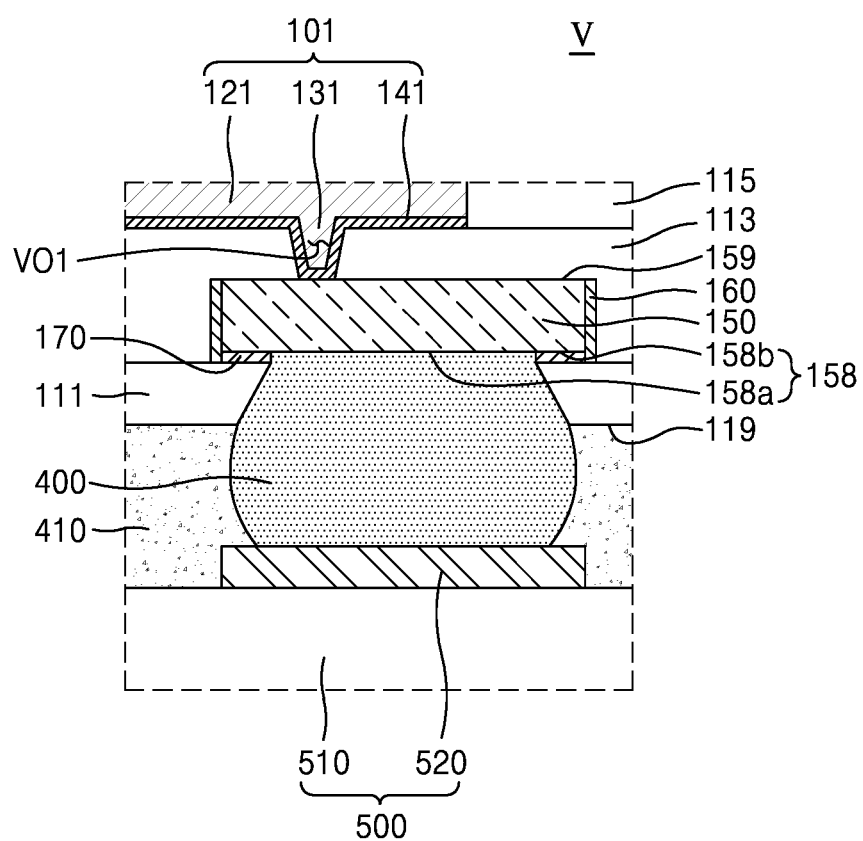
FIG. 5 is an enlarged cross-sectional view showing area V of FIG. 4 according to an exemplary embodiment of the present inventive concepts.

FIG. 4 is a cross-sectional view showing a semiconductor module 1 according to an exemplary embodiment of the present inventive concepts. FIG. 5 is an enlarged diagram showing area V of FIG. 4 according to an exemplary embodiment of the present inventive concepts.

Referring to the exemplary embodiments of FIGS. 4 and 5, the semiconductor module 1 may include a module substrate 500 and the semiconductor package 10 mounted on the module substrate 500.

The module substrate 500 may include a body portion 510 and a wiring 520. A portion of the wiring 520 may function as a substrate pad on which the external connection bump 400 is mounted. For example, as shown in the exemplary embodiment of FIG. 5, a bottom surface of the external connection bump 400 may be mounted directly on a top surface of the wiring 520. In an exemplary embodiment, the module substrate 500 may include a printed circuit board (PCB).

In an exemplary embodiment in which the module substrate 500 includes a PCB, the body portion 510 of the module substrate 500 may be formed in a thin shape by compressing a polymer material, such as thermosetting resin, and the like, epoxy-based resin, such as flame retardant 4 (FR-4), bismaleimide triazine (BT), an ajinomoto build up film (ABF), and the like, or phenol resin, and the like to a certain thickness. The wiring 520, which is a transmission path of an electrical signal, may be formed by applying copper foil on a surface of the body portion 510 and patterning the same.

In the exemplary embodiment of FIG. 4, the module substrate 500 has been illustrated as a single layer PCB on which the wiring 520 is formed on only one surface (e.g., an upper surface) of the body portion 510 of the module substrate 500. However, the module substrate 500 may be implemented with a double layer PCB on which the wiring 520 is formed on both upper and lower surfaces of the body portion 510 of the module substrate 500. However, exemplary embodiments of the present inventive concepts are not limited thereto and the module substrate 500 may include various different structures and/or materials in other exemplary embodiments.

As shown in the exemplary embodiment of FIG. 4, the semiconductor package 10 may be mounted on an upper surface of the module substrate 500. The external connection bump 400 may be disposed between the wiring 520 on an upper surface of the body portion 510 of the module substrate 500 and the lower bump pad 150 (e.g., in the vertical direction). The external connection bump 400 may contact the wiring 520 of the module substrate 500 and the lower bump pad 150, respectively, thus electrically connecting the wiring 520 of the module substrate 500 to the lower bump pad 150. For example, as shown in the exemplary embodiment of FIGS. 4-5, an upper surface of the external connection bump 400 may directly contact a lower surface of the lower bump pad 150 and a lower surface of the external connection bump 400 may directly contact an upper surface of the wiring 520. An under-fill layer 410 covering side surfaces of the external connection bump 400 may be provided between the semiconductor package 10 and the module substrate 500. However, exemplary embodiments of the present inventive concepts are not limited thereto and the under-fill layer 410 may be omitted in some exemplary embodiments.

In a common semiconductor package, a portion of a lower surface of a lower bump pad onto which the external connection bump 400 is attached is exposed by an adjacent redistribution insulating layer, and a side surface of the lower bump pad may directly contact the redistribution insulating layer. Stress tends to be concentrated at a portion in which the lower bump pad and the redistribution insulating layer contact each other, due to heat generated from the semiconductor package and/or shrinkage or relaxation of a solder ball. Such stress may cause cracks to propagate along a side surface of the lower bump pad, and accordingly, the lower bump pad and the redistribution insulating layer are frequently peeled off by the cracks.

However, in an exemplary embodiment of the present inventive concepts, the semiconductor module 1 includes the first conductive barrier layer 160 covering a side surface of the lower bump pad 150 and having excellent adhesion to the second redistribution insulating layer 113. Therefore, the semiconductor module 1 may prevent cracks from propagating along a side surface of the lower bump pad 150, and the peeling of the lower bump pad 150 and the second redistribution insulating layer 113 may be prevented.

In an exemplary embodiment of the present inventive concepts, since an edge portion of the first surface 158 of the lower bump pad 150 of the semiconductor module 1 is covered by the redistribution insulating layer 110, stress concentration at an interface of the lower bump pad 150 and the external connection bump 400 may be lessened. Therefore, since cracks are prevented from being formed around the lower bump pad 150, damage to the lower bump pad 150 and the first to third redistribution patterns 120, 130, and 140 may be prevented, and joining reliability between the semiconductor package 10 and the module substrate 500 and board level reliability may be increased.

Figure 6:
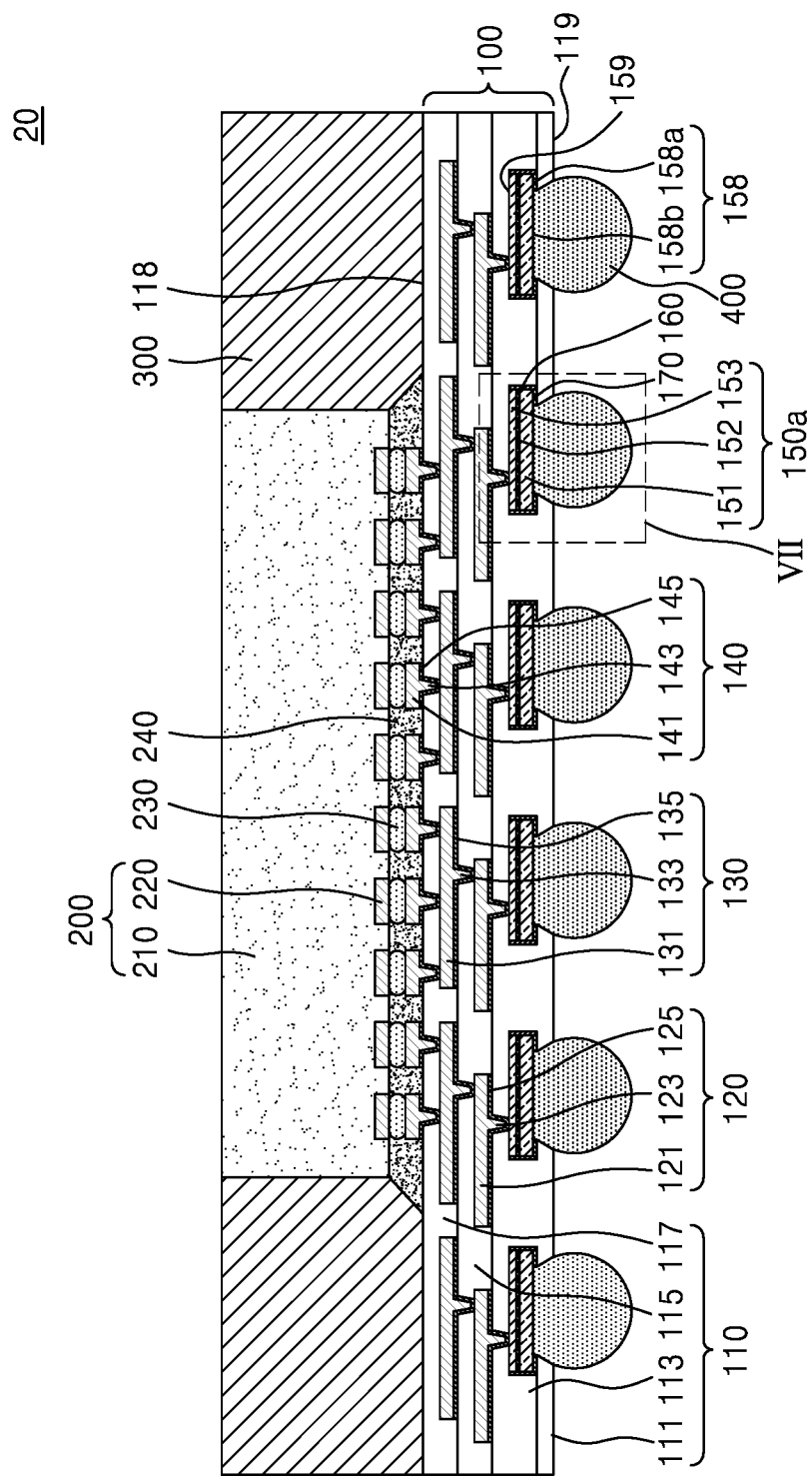
FIG. 6 is a cross-sectional view showing a semiconductor package according to an exemplary embodiment of the present inventive concepts.
Figure 7:
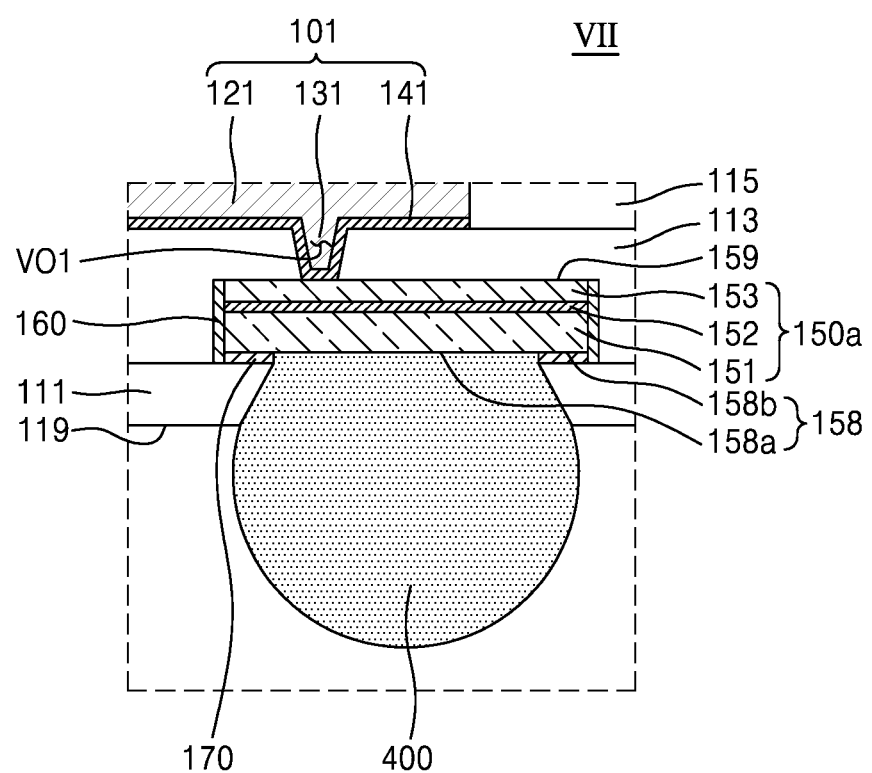
FIG. 7 is an enlarged cross-sectional view showing area VII in FIG. 6 according to an exemplary embodiment of the present inventive concepts.

FIG. 6 is a cross-sectional view showing a semiconductor package 20 according to an exemplary embodiment of the present inventive concepts. FIG. 7 is an enlarged cross-sectional view showing area VII of FIG. 6 according to an exemplary embodiment of the present inventive concepts. The semiconductor package 20 illustrated in the exemplary embodiments of FIGS. 6 and 7 is substantially identical or similar to the semiconductor package 10 described with reference to the exemplary embodiments of FIGS. 1 to 3, except for the structure of a lower bump pad 150a. Therefore, for ease of description, the foregoing descriptions of substantially similar or identical elements are briefly mentioned or omitted, and the following descriptions will be focused on the difference from the semiconductor package 10 described in the exemplary embodiments of FIGS. 1 to 3.

Referring to the exemplary embodiments of FIGS. 6 and 7, the lower bump pad 150a may include a first conductive layer 151 in direct contact with the external connection bump 400, a second conductive layer 153 in direct contact with the first conductive via pattern 123, and a diffusion barrier layer 152 disposed between the first conductive layer 151 and the second conductive layer 153 (e.g., in the vertical direction).

In an exemplary embodiment, the first conductive layer 151 and the second conductive layer 153 may include metal, such as Cu, Al, W, Ti, Ta, In, Mo, Mn, Co, Sn, Ni, Mg, Re, Be, Ga, Ru, and the like, or an alloy thereof.

In an exemplary embodiment, the first conductive layer 151 and the second conductive layer 153 may include a material identical to each other. For example, the first conductive layer 151 and the second conductive layer 153 may each include Cu.

In an exemplary embodiment, the first conductive layer 151 and the second conductive layer 153 may each have an overall uniform thickness, respectively. For example, a length in the vertical direction of the first conductive layer 151 and the second conductive layer 153 may be constant. As shown in the exemplary embodiments of FIGS. 6-7, a thickness of the first conductive layer 151 may be greater than the thickness of the second conductive layer 153.

The diffusion barrier layer 152 may be disposed between the first conductive layer 151 and the second conductive layer 153 (e.g., in the vertical direction). The first conductive layer 151 and the second conductive layer 153 may be spaced apart from each other by the diffusion barrier layer 152. The diffusion barrier layer 152 may be configured to prevent material diffusion between the first conductive layer 151 and the second conductive layer 153.

In an exemplary embodiment, the diffusion barrier layer 152 may be made of Ni, Ti, TiN, Ta, TaN, or a combination thereof. The diffusion barrier layer 152 may be configured to suppress a resistance increase and current leakage between the second conductive layer 153 and the first conductive via pattern 123 by preventing a material constituting the second conductive layer 153 from diffusing toward the external connection bump 400.

In an exemplary embodiment, a length in the horizontal direction of the diffusion barrier layer 152 may be substantially identical to the lengths in the horizontal direction of the first conductive layer 151 and the second conductive layer 153.

A side surface of the diffusion barrier layer 152, a side surface of the first conductive layer 151, and a side surface of the second conductive layer 153 may constitute a side surface of the lower bump pad 150a. For example, as shown in the exemplary embodiments of FIGS. 6-7, side surfaces (e.g., lateral ends) of the diffusion barrier layer 152, the first conductive layer 151, and the second conductive layer 153 may be coplanar with each other.

In an exemplary embodiment, a surface of the external connection bump 400 (e.g., a top surface) that directly contacts the first conductive layer 151 may be substantially coplanar (e.g., in the vertical direction) with a surface (e.g., a top surface) of the second conductive barrier layer 170 that directly contacts the first conductive layer 151. As shown in the exemplary embodiment of FIG. 7, a surface (e.g., a top surface) of the first conductive layer 151 that directly contacts the external connection bump 400 may be flat (e.g., extending substantially in the horizontal direction). In an exemplary embodiment, the distance in the vertical direction between the portion of the first conductive layer 151 that directly contacts the external connection bump 400 to the lower surface 119 of the redistribution insulating layer 110 may be in a range of about 3 μm to about 20 μm as previously described with respect to the exemplary embodiment of FIGS. 1-3.

In an exemplary embodiment, the first conductive barrier layer 160 may surround the lower bump pad 150a and the second conductive barrier layer 170. For example, the first conductive barrier layer 160 may contact side surfaces (e.g., lateral ends) of the first conductive layer 151, side surfaces (e.g., lateral ends) of the second conductive layer 153, side surfaces (e.g., lateral ends) of the diffusion barrier layer 152, and side surfaces (e.g., lateral ends) of the second conductive barrier layer 170, thus surrounding the first conductive layer 151, the second conductive layer 153, the diffusion barrier layer 152, and the second conductive barrier layer 170.

A length in the vertical direction of the first conductive barrier layer 160 may be substantially identical to a sum of the lengths in the vertical direction of the first conductive layer 151, the second conductive layer 153, the diffusion barrier layer 152, and the second conductive barrier layer 170. For example, in an exemplary embodiment a length in the vertical direction of the first conductive barrier layer 160 may be about 5 μm to about 10 μm.

Figure 8:
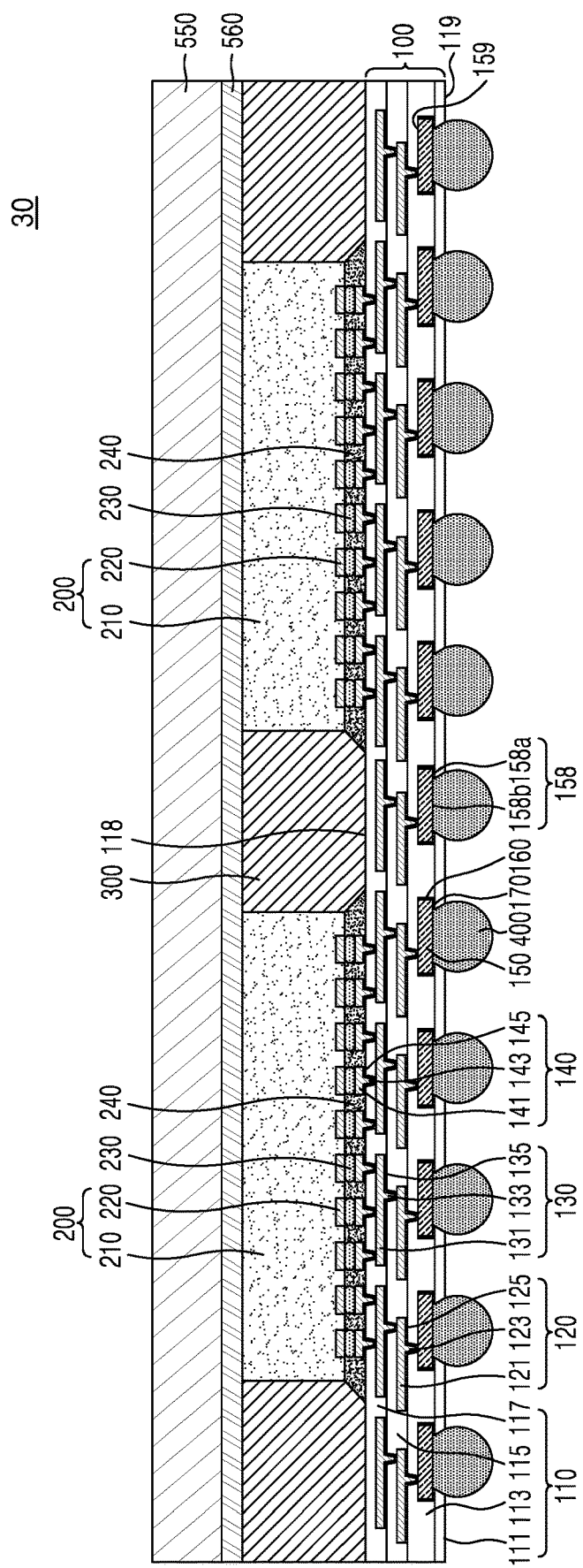
FIG. 8 is a cross-sectional view showing a semiconductor package according to an exemplary embodiment of the present inventive concepts.

FIG. 8 is a cross-sectional view showing a semiconductor package 30 according to an exemplary embodiment of the present inventive concepts. For ease of description, the foregoing descriptions concerning substantially similar or identical elements previously described are briefly mentioned or omitted, and the following descriptions will be focused on the difference from the semiconductor package 10 described in the exemplary embodiments of FIGS. 1 to 3.

Referring to the exemplary embodiment of FIG. 8, the semiconductor package 30 may include a plurality of semiconductor chips 200. For example, as shown in the exemplary embodiment of FIG. 8, the semiconductor package 30 may include two semiconductor chips 200. However, exemplary embodiments of the present inventive concepts are not limited thereto and in other exemplary embodiments, the semiconductor package 30 may include three or more semiconductor chips 200. The semiconductor chips 200 included in the semiconductor package 30 may be homogeneous or heterogeneous types of semiconductor chips.

The semiconductor package 30 may be a system in package (SIP) in which heterogeneous types of semiconductor chips 200 are electrically connected to each other, thus operating as one system.

In an exemplary embodiment, an upper surface of the semiconductor chips 200 may be substantially coplanar (e.g., in the vertical direction) with an upper surface of the molding layer 300. For example, as shown in the exemplary embodiment of FIG. 8, the molding layer 300 surrounds side surfaces (e.g., lateral ends) of the semiconductor chips 200 but may not surround upper surfaces of the semiconductor chips 200.

In an exemplary embodiment, a heat dissipation member 550 may be attached onto an upper surface of the semiconductor chips 200 and an upper surface of the molding layer 300. In an exemplary embodiment, the heat dissipation member 550 may include, a heat slug or a heat sink. For example, the heat slug or the heat sink may have a concavo-convex structure in which concavity and convexity are repeated to increase their surface areas. However, exemplary embodiments of the present inventive concepts are not limited thereto.

As shown in the exemplary embodiment of FIG. 8, an adhesive member 560 may be disposed below the heat dissipation member 550. For example, the adhesive member 560 may be disposed between a lower surface of the heat dissipation member 550 and the upper surfaces of the semiconductor chips 200 and the molding layer 300 for attachment thereto.

In an exemplary embodiment, the adhesive member 560 may include a thermal interface material (TIM). For example, the TIM may include mineral oil, grease, gap filler putty, phase change gel, phase change material pads or particle filled epoxy. However, exemplary embodiments of the present inventive concepts are not limited thereto.

In an exemplary embodiment, the adhesive member 560 may also include a nonconductive film (NCF). The adhesive member 560 may include an insulating polymer film. However, exemplary embodiments of the present inventive concepts are not limited thereto. The adhesive member 560 may include a film having adhesive properties on its own. For example, the adhesive member 560 may include a double-sided adhesive film.

FIGS. 9 to 23 are cross-sectional views sequentially showing a method of manufacturing the semiconductor package 10 according to exemplary embodiments of the present inventive concepts. Hereinafter, with reference to the FIGS. 9 to 23, exemplary embodiments of a method of manufacturing the semiconductor package 10 of FIG. 1 will be described in greater detail.

Figure 9:
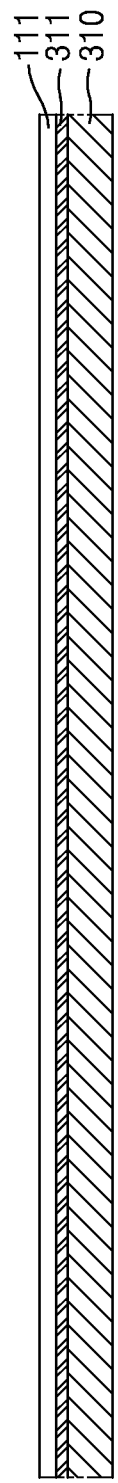
FIGS. 9 to 23 are cross-sectional views sequentially showing a method of manufacturing a semiconductor package according to exemplary embodiments of the present inventive concepts.

Referring to FIG. 9, a method of manufacturing the semiconductor package 10 of the inventive concept may include forming the first redistribution insulating layer 111 on a carrier substrate 310 onto which a release film 311 is attached. For example, as shown in the exemplary embodiment of FIG. 9, the release film 311 and the first redistribution insulating layer 111 may be sequentially disposed on the carrier substrate 310 in the vertical direction In an exemplary embodiment, the carrier substrate 310 may be made of any material having stability against a baking process, an etching process, and the like. In embodiments in which the carrier substrate 310 is separated and removed by laser ablation in a subsequent process, the carrier substrate 310 may include a translucent substrate. In an embodiment in which the carrier substrate 310 is separated and removed by heating in a subsequent process, the carrier substrate 310 may include a heat-resistant substrate.

In an exemplary embodiment, the carrier substrate 310 may include a glass substrate. Alternatively, in another exemplary embodiment, the carrier substrate 310 may be made of a heat resistant organic polymer material, such as at least one compound selected from polyimide (PI), polyetheretherketone (PEEK), polyethersulfone (PES), polyphenylene sulfide (PPS), and the like. However, exemplary embodiments of the present inventive concepts are not limited thereto.

In an exemplary embodiment, the release film 311 may include a laser reaction layer capable of allowing the carrier substrate 310 to be separated by vaporization in response to irradiation of a laser. Alternatively, the release film 311 may include a carbon-based material layer. For example, the release film 311 may include an amorphous carbon layer (ACL). However, exemplary embodiments of the present inventive concepts are not limited thereto.

Figure 10:
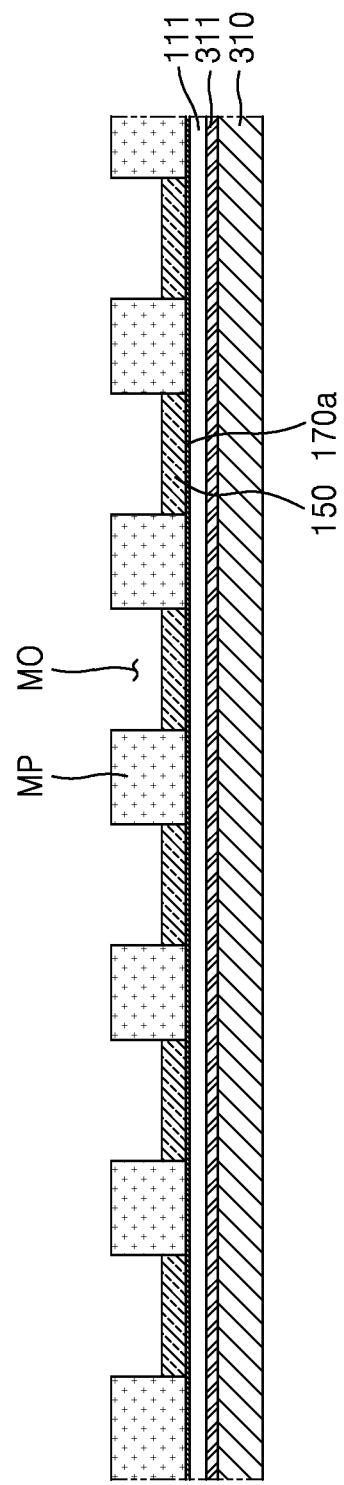

Referring to the exemplary embodiment of FIG. 10, a method of manufacturing the semiconductor package 10 in accordance with the present inventive concepts may include forming a first preliminary conductive barrier layer 170a and the lower bump pad 150 on the first redistribution insulating layer 111. For example, as shown in the exemplary embodiment of FIG. 10, the first preliminary conductive barrier layer 170a and the lower bump pad 150 may be consecutively disposed on the first redistribution insulating layer 111 (e.g., in the vertical direction).

In an exemplary embodiment, the first preliminary conductive barrier layer 170a may be formed through physical vapor deposition. The first preliminary conductive barrier layer 170a may conformally extend on an upper surface of the first redistribution insulating layer 111. The first preliminary conductive barrier layer 170a may form the second conductive barrier layer 170 (refer to FIG. 11) to be described herein below.

A mask pattern MP including a mask opening MO may be formed on the first preliminary conductive barrier layer 170a following the forming of the first preliminary conductive barrier layer 170a described above. The mask opening MO of the mask pattern MP exposes a portion of the first preliminary conductive barrier layer 170a and may define an area in which the lower bump pad 150 is formed in a subsequent process.

The lower bump pad 150 may then be formed on a portion of the first preliminary conductive barrier layer 170a exposed through the mask opening MO of the mask pattern MP following the forming of the mask pattern MP. In an exemplary embodiment, the lower bump pad 150 may be formed through a plating process using the first preliminary conductive barrier layer 170a as a seed.

Figure 11:
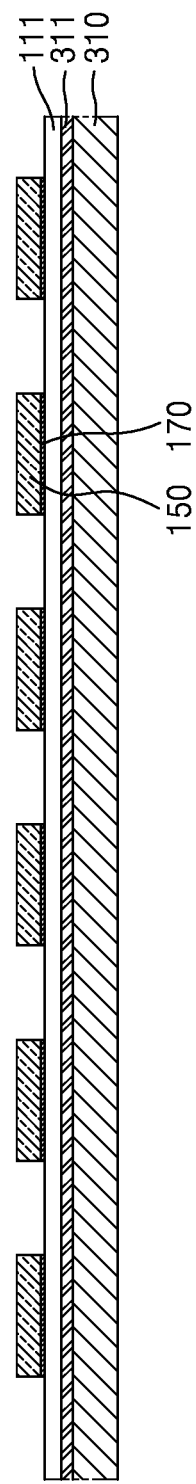

Referring to the exemplary embodiment of FIG. 11, a method of manufacturing the semiconductor package 10 according to the present inventive concepts may include removing the mask pattern MP and removing a portion of the first preliminary conductive barrier layer 170a exposed to the outside from the removal of the mask pattern MP.

In an exemplary embodiment, the portion of the first preliminary conductive barrier layer 170a exposed to the outside as the MP is removed may be removed in the same process. The first preliminary conductive barrier layer 170a disposed below the lower bump pad 150 may remain to form the second conductive barrier layer 170.

Figure 12:
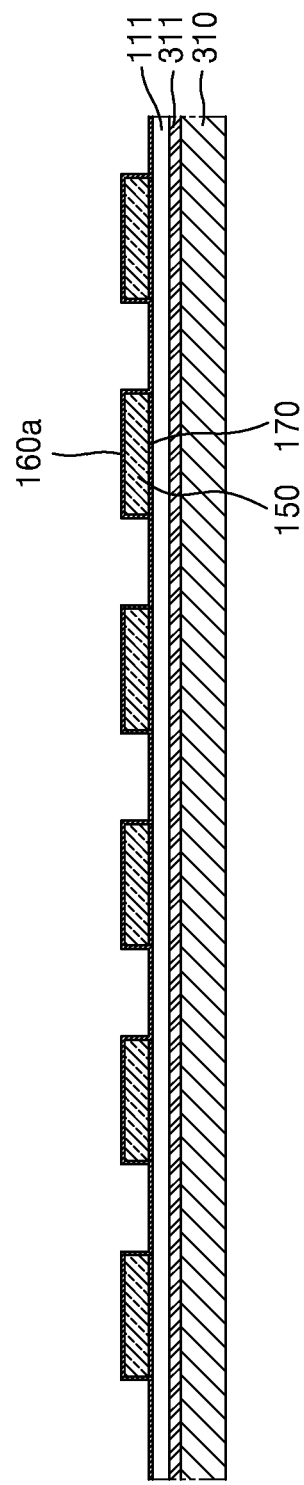

Referring to the exemplary embodiment of FIG. 12, a method of manufacturing the semiconductor package 10 according to the present inventive concepts may include forming a second preliminary conductive barrier layer 160a.

In an exemplary embodiment, the second preliminary conductive barrier layer 160a may be formed through physical vapor deposition. However, exemplary embodiments of the present inventive concepts are not limited thereto. The second preliminary conductive barrier layer 160a may conformally extend on a portion of an upper surface of the first redistribution insulating layer 111, side surfaces (e.g., lateral ends) of the second conductive barrier layer 170, and side surfaces and an upper surface of the lower bump pad 150. The second preliminary conductive barrier layer 160a may form the first conductive barrier layer 160.

In an exemplary embodiment, the second preliminary conductive barrier layer 160a may extend on a portion of an upper surface of the first redistribution insulating layer 111, side surfaces (e.g., lateral ends) of the second conductive barrier layer 170, and side surfaces and upper surface of the lower bump pad 150 to a thickness in a range of about 0.50 µm to about 0.10 µm.

Figure 13:
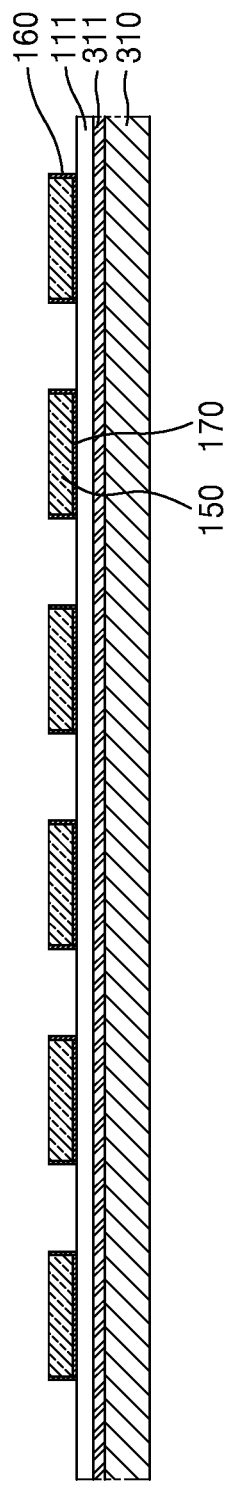

Referring to the exemplary embodiment of FIG. 13, a method of manufacturing the semiconductor package 10 according to the present inventive concepts may include removing a portion of the second preliminary conductive barrier layer 160a. For example, as shown in the exemplary embodiment of FIG. 13, a portion of the second preliminary conductive barrier layer 160a disposed on an upper surface of the first redistribution insulating layer 111 and an upper surface of the lower bump pad 150 may be removed.

In an exemplary embodiment, a portion of the second preliminary conductive barrier layer 160a may be removed by wet etching. For example, the portions of the second preliminary conductive barrier layer 160a disposed on an upper surface of the first redistribution insulating layer 111 and an upper surface of the lower bump pad 150 may be removed by a chemical reaction of an etching solution. Accordingly, an upper surface of the first redistribution insulating layer 111 and an upper surface of the lower bump pad 150 may be exposed.

However, exemplary embodiments of the present inventive concepts are not limited thereto. For example, in another exemplary embodiment, the portions of the second preliminary conductive barrier layer 160a disposed on an upper surface of the first redistribution insulating layer 111 and an upper surface of the lower bump pad 150 may be removed through a dry etching process. For example, the second preliminary conductive barrier layer 160a on an upper surface of the first redistribution insulating layer 111 and an upper surface of the lower bump pad 150 may be removed by a chemical and/or physical reaction of etching gas in a plasma state.

In an exemplary embodiment, the second preliminary conductive barrier layer 160a on a side surface of the lower bump pad 150 may not be etched. The second preliminary conductive barrier layer 160a on a side surface of the lower bump pad 150 may be the first conductive barrier layer 160 described above. However, exemplary embodiments of the present inventive concepts are not limited thereto. In an exemplary embodiment, a partial portion of the second preliminary conductive barrier layer 160a disposed on a side surface of the lower bump pad 150 may be removed through an etching process. For example, a partial portion of the second preliminary conductive barrier layer 160a on a side surface of the lower bump pad 150 may be removed through an etching process, thus being formed to a thickness in a range of about 0.02 μm to about 0.07 μm.

In an exemplary embodiment, the first conductive barrier layer 160 may be formed in a ring shape extending along a side surface of the lower bump pad 150. For example, the first conductive barrier layer 160 may contact a side surface of the lower bump pad 150 and a side surface of the second conductive barrier layer 170 to surround the lower bump pad 150 and the second conductive barrier layer 170.

Figure 14:
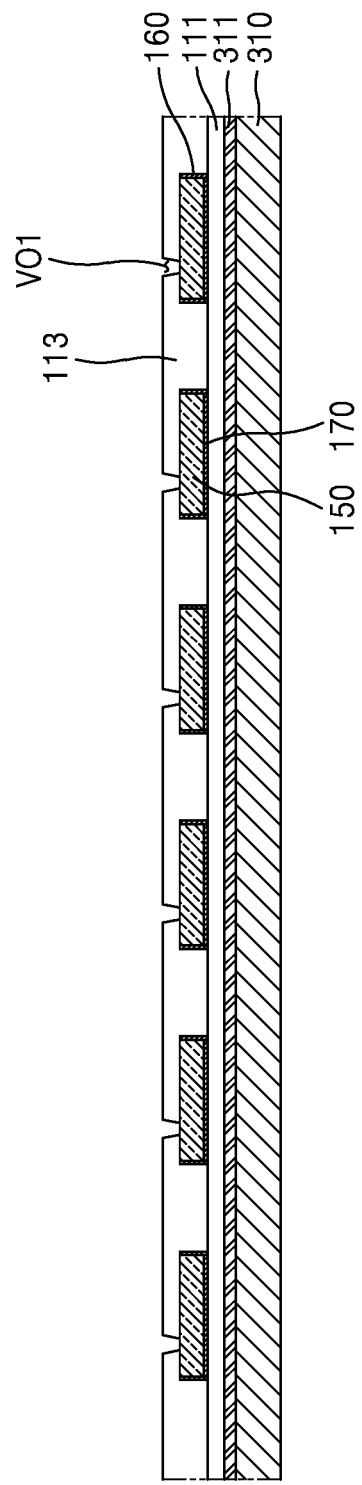

Referring to the exemplary embodiment of FIG. 14, a method of manufacturing the semiconductor package 10 according to the present inventive concepts may include forming the second insulating layer 113 including the first via opening VO1 exposing a portion of the lower bump pad 150.

In an exemplary embodiment, in the formation of the second redistribution insulating layer 113, the first via opening VO1 may be formed by forming an insulating material film covering the lower bump pad 150 and the first redistribution insulating layer 11*l* and executing an exposure process and a development process to remove a portion of the insulating material film. A portion of the second surface 159 (refer to FIG. 2) of the lower bump pad 150 may be exposed by the first via opening VO1.

In an exemplary embodiment, a reactive ion etching (RIE) process using plasma, laser drilling, and the like may be executed to form the first via opening VO1. However exemplary embodiments of the present inventive concepts are not limited thereto. The first via opening VO1 may have a shape in which its cross-sectional surface area in the horizontal direction gradually increases upward in a direction away from the second surface 159 of the lower bump pad 150.

Figure 15:
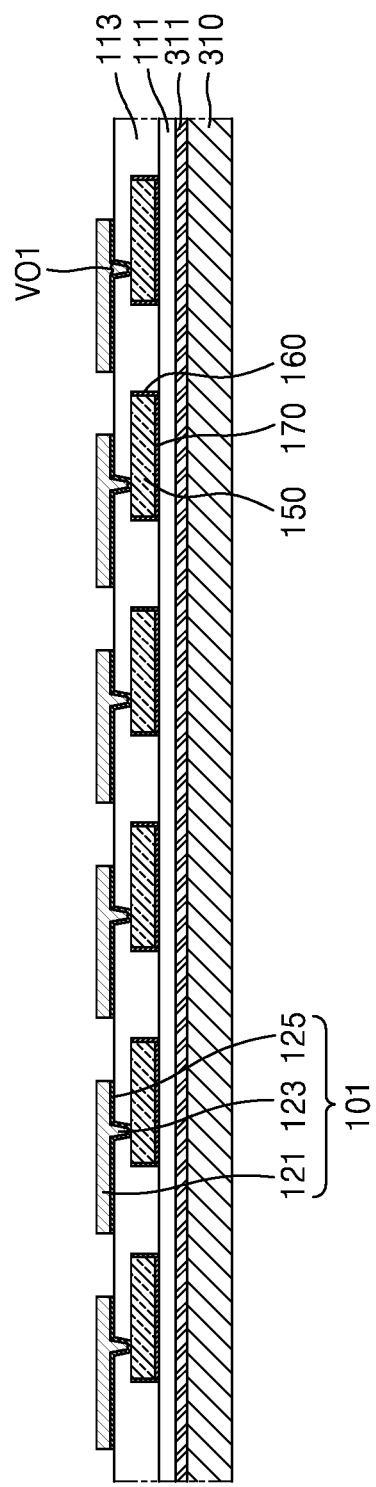

Referring to the exemplary embodiment of FIG. 15, a method of manufacturing the semiconductor package 10 according to the present inventive concepts may include forming the first redistribution pattern seed layer 125, the first conductive line pattern 121, and the first conductive via pattern 123 on the structure shown in the exemplary embodiment of FIG. 14.

In an exemplary embodiment, the first redistribution pattern seed layer 125 may be formed to cover an upper surface of the second redistribution insulating layer 113, an inner wall of the second redistribution insulating layer 113 provided by the first conductive via pattern 123 and the first via opening VO1, and a portion of the second surface 159 (refer to FIG. 2) of the lower bump pad 150 exposed through the first via opening VO1.

In an exemplary embodiment, the first conductive line pattern 121 may extend along an upper surface of the second redistribution insulating layer 113, and the first conductive via pattern 123 may fill the first via opening VO1. The first redistribution pattern seed layer 125, the first conductive line pattern 121, and the first conductive via pattern 123 may constitute the first redistribution pattern 120.

Figure 16:
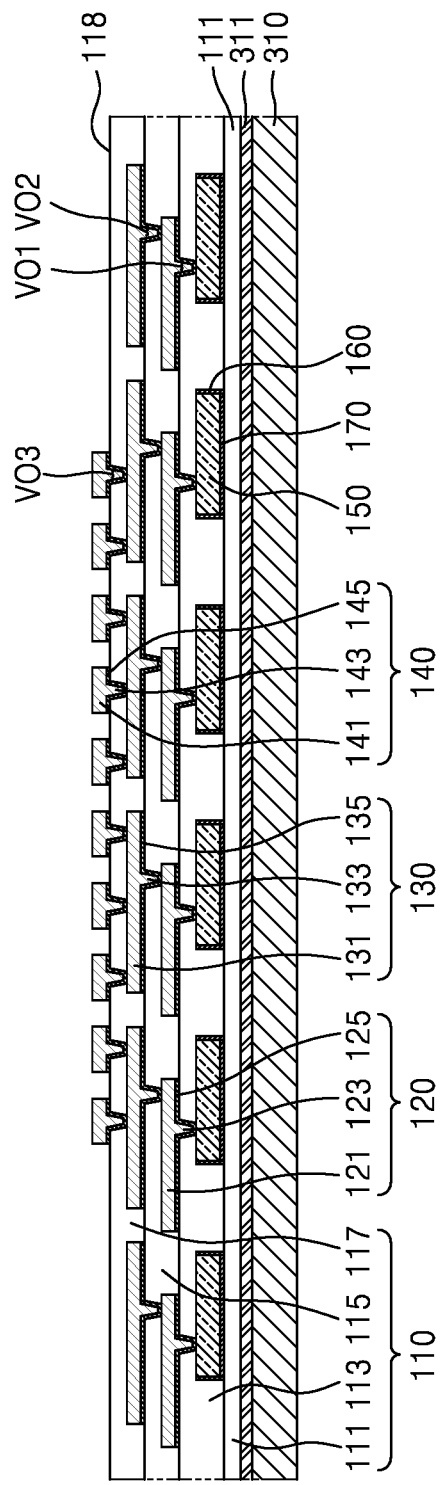

Referring to the exemplary embodiment of FIG. 16, a method of manufacturing the semiconductor package 10 according to the present inventive concepts may include sequentially forming the third redistribution insulating layer 115 including the second via opening VO2, the second redistribution pattern 130, the fourth redistribution insulating layer 117 including the third via opening VO3, and the third redistribution pattern 140 on the structure shown in the exemplary embodiment of FIG. 15, through a process substantially identical or similar to the descriptions provided with respect to the exemplary embodiments of FIGS. 14 and 15.

In an exemplary embodiment, the second redistribution pattern seed layer 135 may be formed to cover an upper surface of the third redistribution insulating layer 115, an inner wall of the third redistribution insulating layer 115 provided by the second conductive via pattern 133 and the second via opening VO2, and a portion of the first conductive line pattern 121 exposed through the second via opening VO2. The second conductive line pattern 131 may extend along an upper surface of the third redistribution insulating layer 115, and the second conductive via pattern 133 may fill the second via opening VO2. The second redistribution pattern seed layer 135, the second conductive line pattern 131, and the second conductive via pattern 133 may constitute the second redistribution pattern 130.

The third redistribution pattern seed layer 145 may be formed to cover an upper surface of the fourth redistribution insulating layer 117, an inner wall of the fourth redistribution insulating layer 117 provided by the third conductive via pattern 143 and the third via opening VO3, and a portion of the second conductive line pattern 131 exposed through the third via opening VO3.

In an exemplary embodiment, the third conductive line pattern 141 may extend along an upper surface of the fourth redistribution insulating layer 117, and the third conductive via pattern 143 may fill the third via opening VO3. The third redistribution pattern seed layer 145, the third conductive line pattern 141, and the third conductive via pattern 143 may constitute the third redistribution pattern 140.

Figure 17:
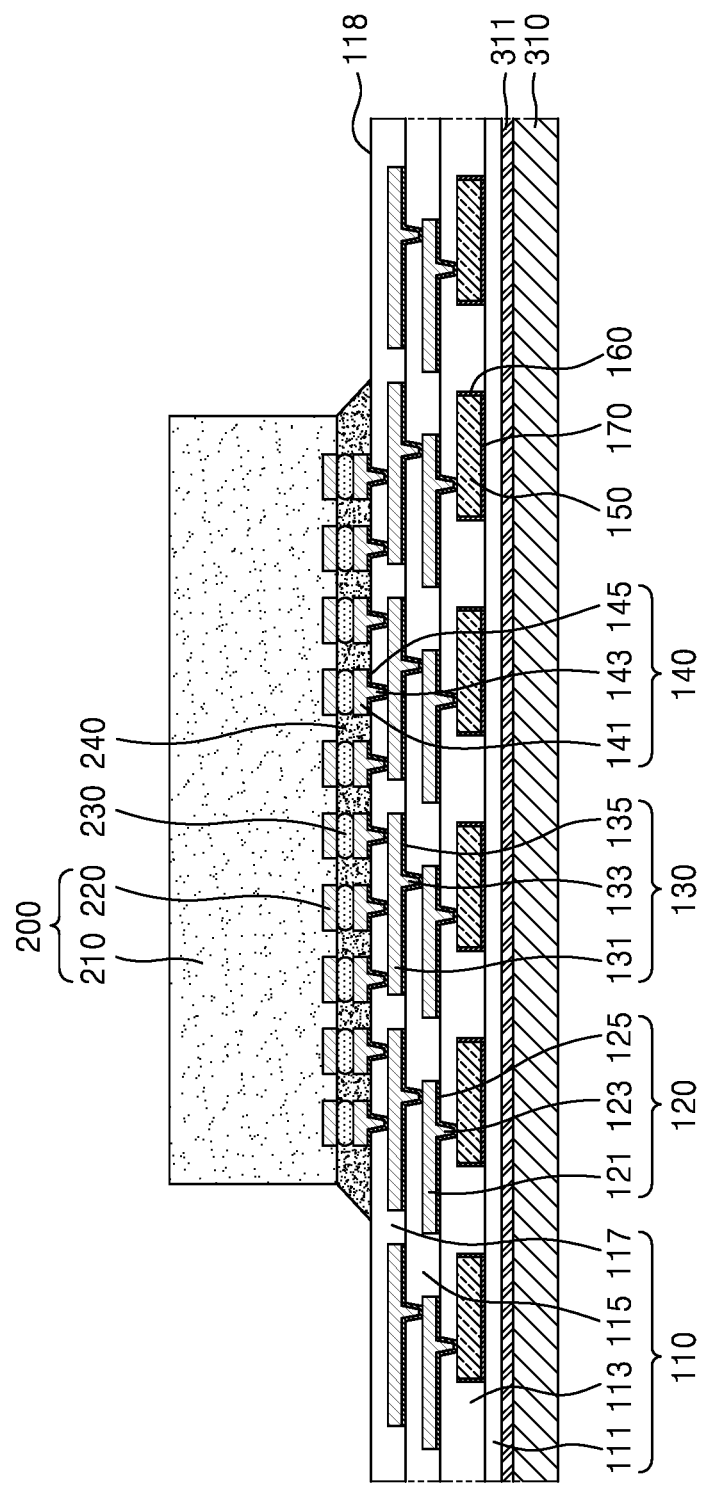

Referring to the exemplary embodiment of FIG. 17, a method of manufacturing the semiconductor package 10 according to the present inventive concepts may include attaching the semiconductor chip 200 onto the structure of the exemplary embodiment of FIG. 16. The chip pad 220 of the semiconductor chip 200 may be connected to the third conductive line pattern 141, through the chip connection terminal 230. For example, the chip pad 220 of the semiconductor chip 200 may be electrically connected to the third conductive line pattern 141 of the third redistribution pattern 140, through the chip connection terminal 230.

Figure 22:
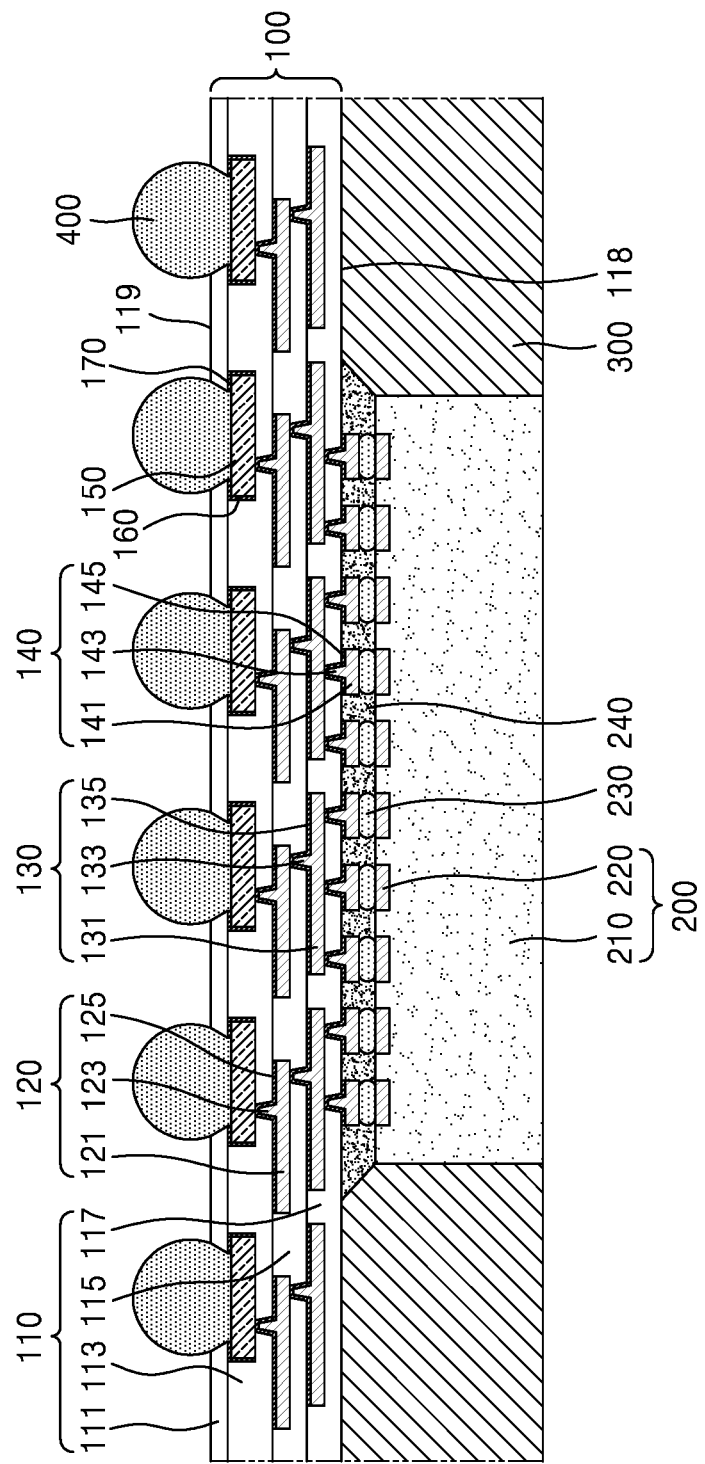

The under-fill material layer 240 filling a space between the semiconductor chip 200 and the upper surface 118 of the redistribution insulating layer 110 (e.g., in the vertical direction) may be formed following the electrical connection of the semiconductor chip 200 to the third conductive line pattern 141 and attachment of the semiconductor chip 200 onto elements forming the redistribution structure 100 (see FIG. 22). The under-fill material layer 240 may cover side surfaces of the chip connection terminal 230. In an exemplary embodiment, the under-fill material layer 240 may be formed by a capillary under-fill method. In an exemplary embodiment, the under-fill material layer 240 may be formed by attaching an NCF onto the chip pad 220 of the semiconductor chip 200 and then attaching the semiconductor chip 200 onto the upper surface 118 of the redistribution insulating layer t 10. However, exemplary embodiments of the present inventive concepts are not limited thereto.

Figure 18:
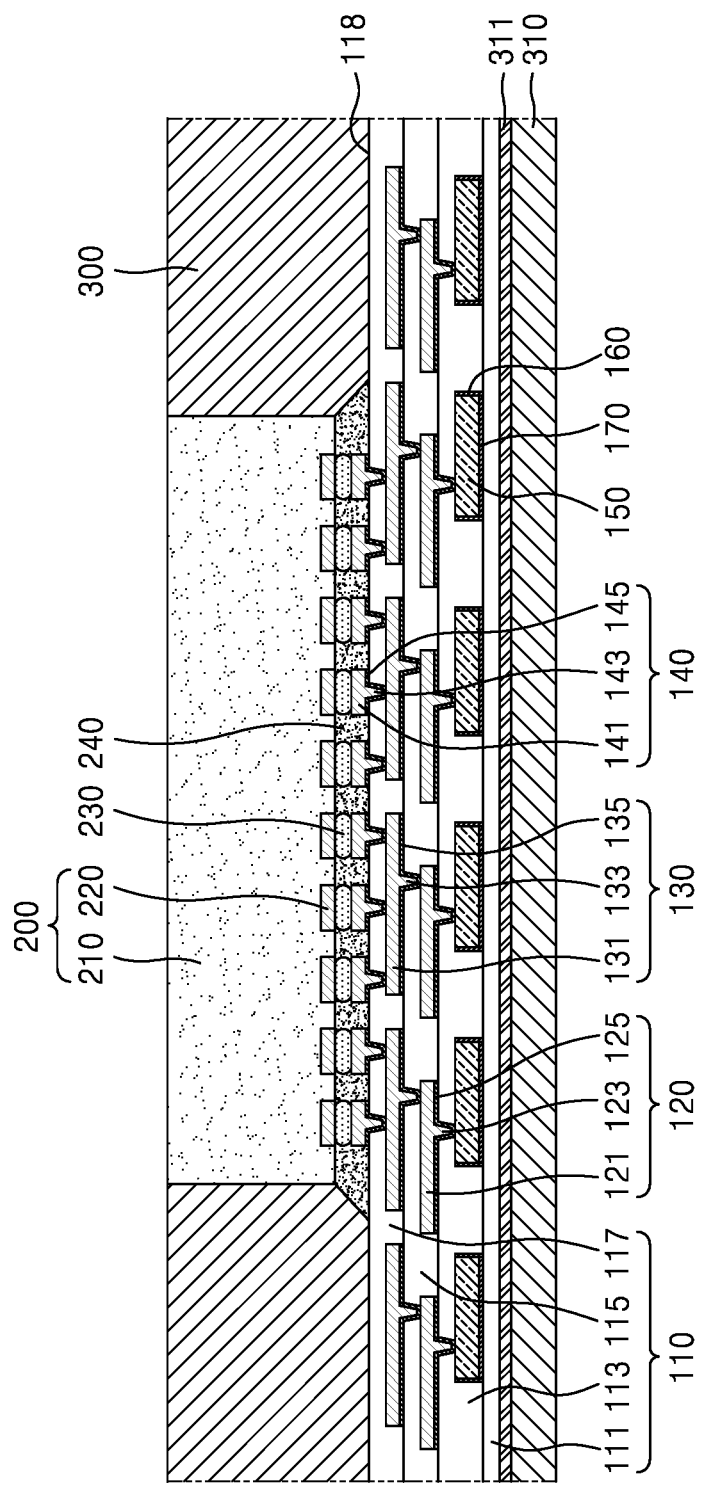

Referring to the exemplary embodiment of FIG. 18, a method of manufacturing the semiconductor package 10 according to the present inventive concepts may include forming the molding layer 300 for molding the semiconductor chip 200. The molding layer 300 covers side surfaces of the semiconductor chip 200 (e.g., lateral side surfaces) and may expose an upper surface of the semiconductor chip 200. The molding layer 300 may also cover a portion of the upper surface 118 of the redistribution insulating layer 110 and side surfaces of the under-fill material layer 240.

However, exemplary embodiments of the present inventive concept are not limited thereto. For example, in another exemplary embodiment, the molding layer 300 may be formed to further cover an upper surface of the semiconductor chip 200. In this exemplary embodiment, the semiconductor chip 200 may not be exposed to the outside.

Figure 19:
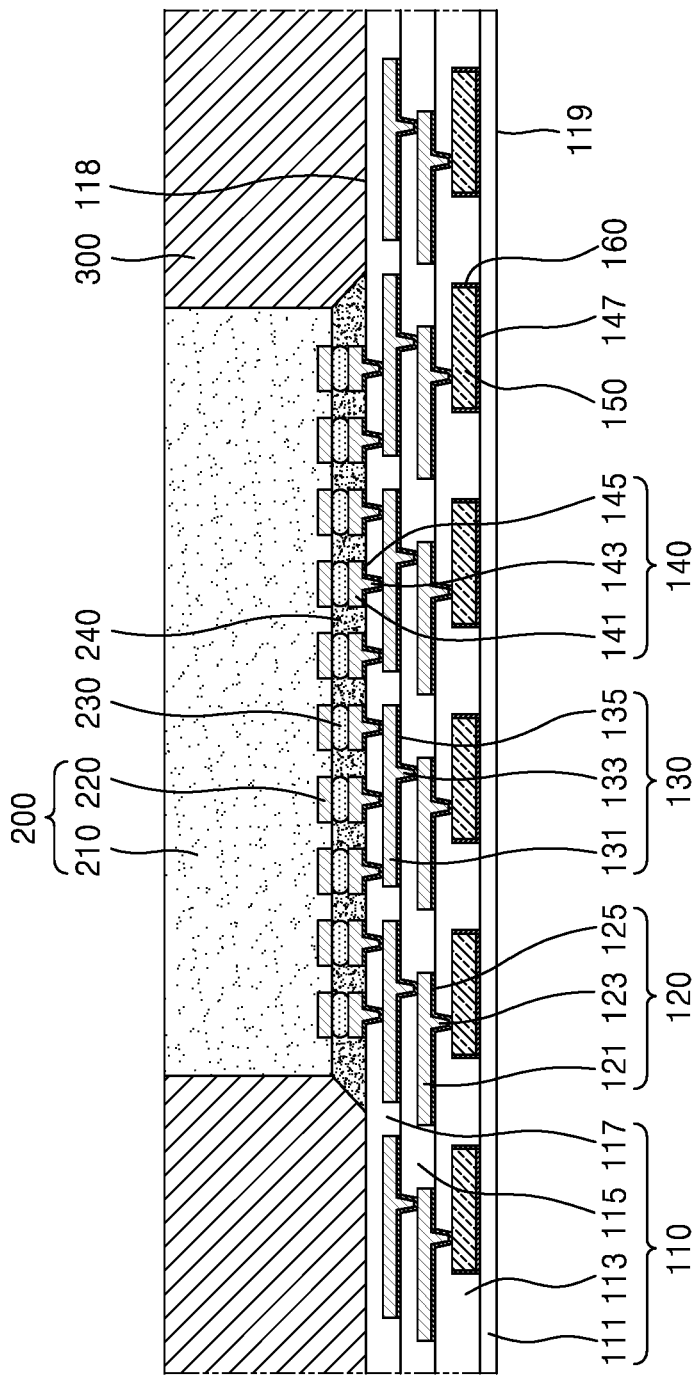

Referring to the exemplary embodiment of FIG. 19, a method of manufacturing the semiconductor package 10 according to the present inventive concepts may include removing the carrier substrate 310. In an exemplary embodiment, the carrier substrate 310 onto which the release film 311 is attached may be separated from the structure shown in the exemplary embodiment of FIG. 18. For example, in order to separate the carrier substrate 310, the release film 311 may be irradiated with laser or heat. Following the separation of the carrier substrate 310, the first redistribution insulating layer 111 may be exposed.

Figure 20:
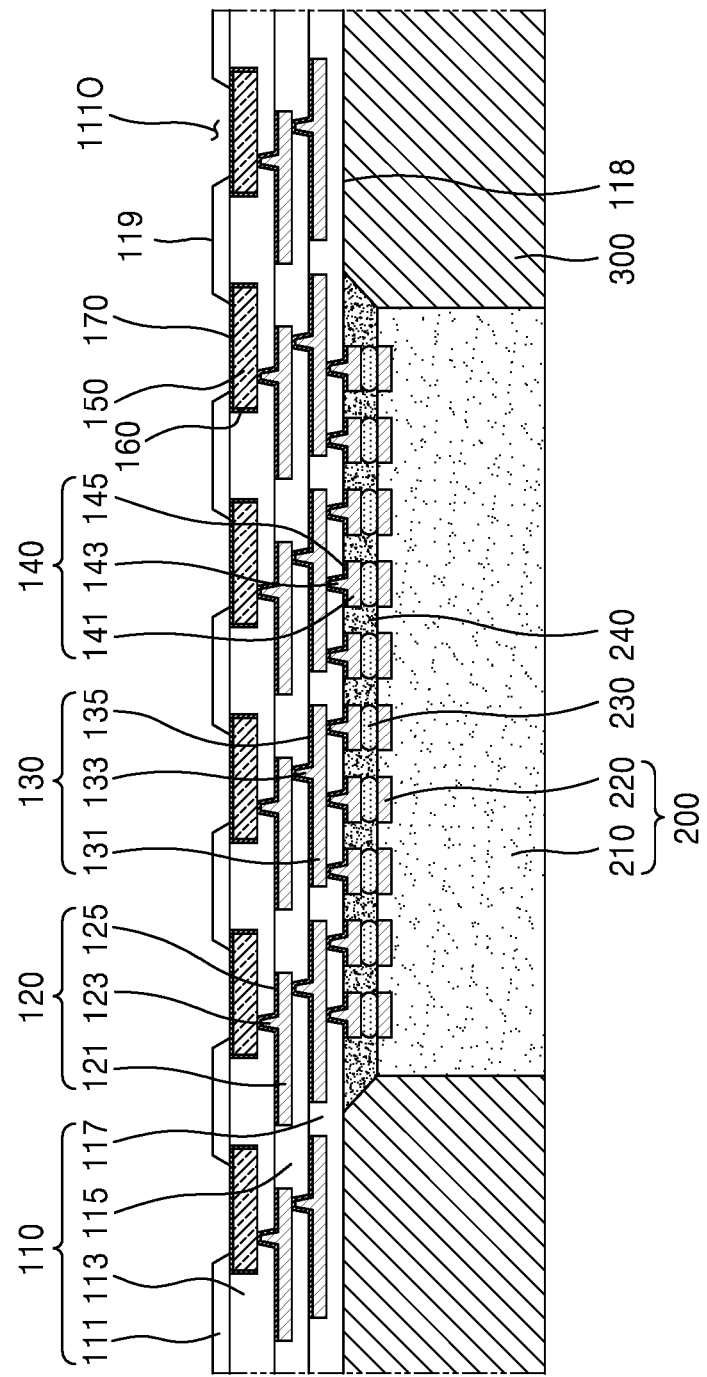

Referring to the exemplary embodiment of FIG. 20, a method of manufacturing the semiconductor package 10 according to the present inventive concepts may include forming a pad opening 111O exposing the second conductive barrier layer 170 by inverting the structure shown in the exemplary embodiment of FIG. 19 and then removing a portion of the first redistribution insulating layer 111.

In an exemplary embodiment, the pad opening 111O may be formed by performing an RIE process using plasma, laser drilling, and the like. However, exemplary embodiments of the present inventive concepts are not limited thereto.

In an exemplary embodiment, the pad opening 111O may have a shape in which its width in the horizontal direction gradually increases upward. For example, the pad opening 111O may have a width that increases in the horizontal direction in a direction away from the lower bump pad 150. As shown in the exemplary embodiment of FIG. 20, an inner wall of the first redistribution insulating layer 111 provided by the pad opening 111O may have an inclined side wall portion. In an exemplary embodiment, an angle formed by the inclined side wall portion and a lower surface of the first redistribution insulating layer 111 may be in a range of greater than about 65 degrees to less than about 90 degrees.

Figure 21:
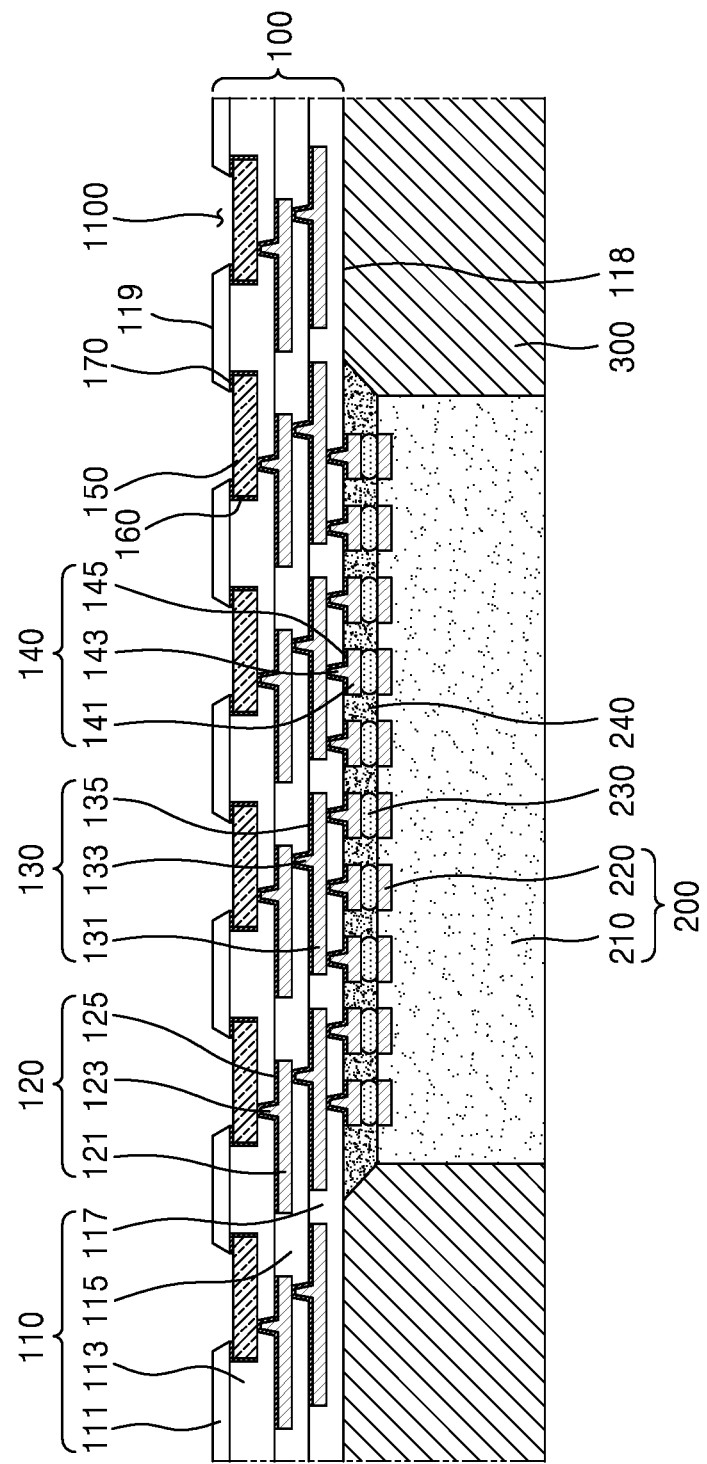

Referring to the exemplary embodiment of FIG. 21, a method of manufacturing the semiconductor package 10 according to the present inventive concepts may include removing a portion of the second conductive barrier layer 170 exposed through the pad opening 111O. As a portion of the second conductive barrier layer 170 is removed, the contact portion 158a of the first surface 158 of the lower bump pad 150 may be exposed through the pad opening 111O.

In an exemplary embodiment, a wet etching process may be performed to remove the portion of the second conductive barrier layer 170 exposed through the pad opening 111O. However, exemplary embodiments of the present inventive concepts are not limited thereto. The portion of the second conductive barrier layer 170 covered by the first redistribution insulating layer 111 may remain.

In an exemplary embodiment, as described above, the first to fourth redistribution insulating layers 111, 113, 115, and 117, the first to third redistribution patterns 120, 130, and 140, the lower bump pad 150, the first conductive barrier layer 160, and the second conductive barrier layer 170 may form the redistribution structure 100.

Referring to the exemplary FIG. 22, a method of manufacturing the semiconductor package 10 according to the present inventive concepts may include attaching the external connection bump 400 onto the lower bump pad 150. For example, as shown in the exemplary embodiment of FIG. 22, the external connection bump 400 may include a plurality of external connection bumps attached onto a plurality of lower bump pads 150. The external connection bump 400 may be formed to fill the first pad opening 111O in the first redistribution insulating layer 111 and the first portion directly contacts the first surface 158 of the lower bump pad 150 exposed through the first pad opening 111O. In an exemplary embodiment, the external connection bump 400 may include a solder ball or a solder bump. However, exemplary embodiments of the present inventive concepts are not limited thereto.

In an exemplary embodiment, the arranging of a solder ball on the first surface 158 of the lower bump pad 150 exposed by the pad opening 111O may be performed through a solder ball attachment process. The forming of the external connection bump 400 joined to the lower bump pad 150 may be subsequently performed by melting the solder ball through a reflow process.

Figure 23:
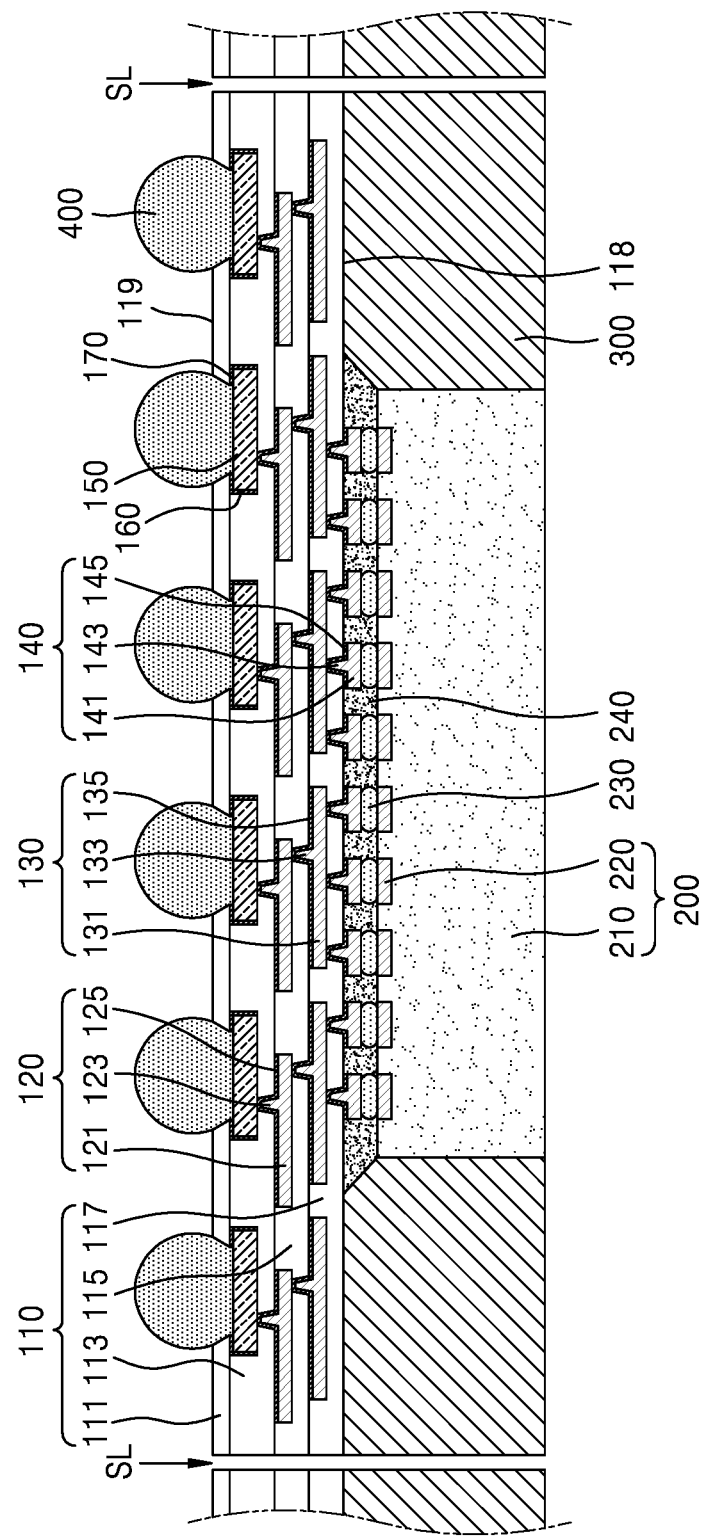

Referring to the exemplary embodiment of FIG. 23, a method of manufacturing the semiconductor package 10 according to the present inventive concepts may include cutting the structure shown in the exemplary embodiment of FIG. 22 along a scribe lane (SL). A customized semiconductor package 10 may be formed through the cutting process, as illustrated in the exemplary embodiment of FIG. 1.

While the present inventive concepts has been particularly shown and described with reference to exemplary embodiments thereof, it will be understood that various changes in form and details may be made therein without departing from the spirit and scope of the following claims.

What is claimed is:

1. A method of manufacturing a semiconductor package, the method comprising:
   forming a first redistribution insulating layer;
   forming a lower bump pad on the first redistribution insulating layer, the lower bump pad comprising a first surface facing the first redistribution insulating layer and a second surface opposite the first surface;
   forming a first conductive barrier layer in contact with a side surface of the lower bump pad;
   forming a second redistribution insulating layer on the first redistribution insulating layer and the lower bump pad, the second redistribution insulating layer including a via opening that exposes a part of the second surface of the lower bump pad, the second redistribution insulating layer directly contacting the first conductive barrier layer;
   forming a redistribution pattern in the via opening of the second redistribution insulating layer, the redistribution pattern being connected to the lower bump pad;
   disposing a semiconductor chip on the second redistribution insulating layer;

forming a first opening in the first redistribution insulating layer; and forming an external connection bump filling the first opening of the first redistribution insulating layer and in contact with the first surface of the lower bump pad, wherein the first conductive barrier layer does not extend between the lower bump pad and the external connection bump.

2. The method of claim 1, wherein the redistribution pattern comprises:

a conductive via pattern extending in the via opening of the second redistribution insulating layer; and a conductive line pattern extending along a surface of the second redistribution insulating layer and connected to the conductive via pattern, and a width in a horizontal direction of the conductive via pattern increases in a direction away from the second surface of the lower bump pad.

3. The method of claim 1, wherein the external connection bump comprises a first portion filling the first opening of the first redistribution insulating layer, and a width in a horizontal direction of the first portion of the external connection bump increase in a direction away from the first surface of the lower bump pad.

4. The method of claim 1, wherein the first surface of the lower bump pad comprises:

a contact portion disposed at a central portion of the lower bump pad and in direct contact with the external connection bump; and a cover portion disposed at an outer portion of the lower bump pad and not in contact with the external connection bump.

5. The method of claim 1, wherein the first conductive barrier layer extends from an upper end portion to a lower end portion of the side surface of the lower bump pad.

6. The method of claim 1, wherein the lower bump pad includes copper, and the first conductive barrier layer includes at least one of nickel and titanium.

7. The method of claim 1, further comprising, before the forming of the lower bump pad, forming a second conductive barrier layer on the first redistribution insulating layer, wherein the first surface of the lower bump pad is in contact with the second conductive barrier layer.

8. The method of claim 7, further comprising, after the forming of the first opening in the first redistribution insulating layer, removing a part of the second conductive barrier layer that is exposed through the first opening of the first redistribution insulating layer.

9. The method of claim 8, wherein the second conductive barrier layer is in contact with the external connection bump.

10. The method of claim 1, further comprising, before the forming of the lower bump pad, forming a mask pattern on the first redistribution insulating layer, the mask pattern including a mask opening, wherein, in the forming of the lower bump pad, the lower bump pad is formed in the mask opening of the mask pattern, and the mask pattern is removed after the forming of the lower bump pad.

11. The method of claim 1, further comprising, after disposing of the semiconductor chip on the second redistribution insulating layer, forming a molding layer that covers a side surface of the semiconductor chip.

12. The method of claim 11, wherein an upper surface of the molding layer is coplanar with an upper surface of the semiconductor chip.

13. The method of claim 1, wherein the lower bump pad comprises a first conductive layer, a diffusion barrier layer on the first conductive layer, and a second conductive layer on the diffusion barrier layer, and the first conductive barrier layer is in contact with a side surface of the first conductive layer, a side surface of the diffusion barrier layer, and a side surface of the second conductive layer.

14. A method of manufacturing a semiconductor package, the method comprising:

forming a redistribution structure on a carrier substrate, the redistribution structure comprising a lower bump pad including a first surface and a second surface opposite each other, a redistribution pattern in contact with the second surface of the lower bump pad, a first conductive barrier layer in contact with a side surface of the lower bump pad, a second conductive barrier layer in contact with the first surface of the lower bump pad, and a first redistribution insulating layer extending between the lower bump pad and the redistribution pattern, wherein the first redistribution insulating layer directly contacts the first conductive barrier layer, disposing a semiconductor chip on the redistribution structure;

forming a molding layer on the redistribution structure, the molding layer surrounding the side surface of the semiconductor chip;

separating the carrier substrate from the redistribution structure;

forming a first opening in a second redistribution insulating layer, the first opening exposing a central portion of the first surface of the lower bump pad; and forming an external connection bump filling the first opening of the second redistribution insulating layer and in direct contact with the central portion of the first surface of the lower bump pad, wherein the first conductive barrier layer does not extend between the lower bump pad and the external connection bump.

15. A method of manufacturing a semiconductor package, the method comprising:

forming a first redistribution insulating layer on a carrier substrate;

forming a mask pattern on the first redistribution insulating layer, the mask pattern including a mask opening;

forming a lower bump pad in the mask opening of the mask pattern, the lower bump pad including a first surface facing the first redistribution insulating layer and a second surface opposite the first surface;

removing the mask pattern;

forming a first conductive barrier layer extending along the side surface of the lower bump pad and in contact with the side surface of the lower bump pad;

forming a second redistribution insulating layer on the first redistribution insulating layer and the lower bump pad, the second redistribution insulating layer including a via opening that exposes a part of the second surface of the lower bump pad;

forming a redistribution pattern that comprises a conductive via pattern and a conductive line pattern, the conductive via pattern extending in a vertical direction in the via opening of the second redistribution insulating layer, and the conductive line pattern extending along a surface of the second redistribution insulating layer and being connected to the conductive via pattern;

disposing a semiconductor chip on the second redistribution insulating layer;

forming a molding layer on the second redistribution insulating layer, the molding layer surrounding a side surface of the semiconductor chip;

removing the carrier substrate;

forming a first opening in the first redistribution insulating layer; and forming an external connection bump filling the first opening of the first redistribution insulating layer and in contact with the first surface of the lower bump pad.

16. The method of claim 15, wherein a width in a horizontal direction of the via opening of the second redistribution insulating layer increases in a direction away from the second surface of the lower bump pad, and a width in a horizontal direction of the first opening of the first redistribution insulating layer increases in a direction away from the first surface of the lower bump pad.

17. The method of claim 15, further comprising, before the forming of the lower bump pad, forming a second conductive barrier layer on the first redistribution insulating layer, wherein the lower bump pad is formed on the second conductive barrier layer, and the first surface of the lower bump pad is in contact with the second conductive barrier layer.

18. The method of claim 17, further comprising, after the forming of the first opening in the first redistribution insulating layer, removing a part of the second conductive barrier layer that is exposed through the first opening of the first redistribution insulating layer and exposing the central portion of the first surface of the lower bump pad, wherein the external connection bump is in direct contact with the central portion of the first surface of the lower bump pad.

19. The method of claim 18, wherein an outer portion of the first surface of the lower bump pad is in contact with the second conductive barrier layer, and the second conductive barrier layer is in direct contact with the external connection bump.

20. The method of claim 19, wherein a surface of the external connection bump in contact with the central portion of the first surface of the lower bump pad is coplanar with a surface of the second conductive barrier layer in contact with the outer portion of the first surface of the lower bump pad.

* * * * *